(12) United States Patent
Fujii et al.

(10) Patent No.: US 11,728,782 B2
(45) Date of Patent: Aug. 15, 2023

(54) RESONATOR DEVICE AND METHOD FOR MANUFACTURING RESONATOR DEVICE

(71) Applicant: SEIKO EPSON CORPORATION, Tokyo (JP)

(72) Inventors: Masahiro Fujii, Shiojiri (JP); Koji Kitahara, Ina (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/873,204

(22) Filed: Jul. 26, 2022

(65) Prior Publication Data

US 2023/0033936 A1 Feb. 2, 2023

(30) Foreign Application Priority Data

Jul. 27, 2021 (JP) ................. 2021-122329

(51) Int. Cl.
*H03H 3/02* (2006.01)
*H03B 5/32* (2006.01)
*H03B 5/04* (2006.01)

(52) U.S. Cl.
CPC ............. *H03H 3/02* (2013.01); *H03B 5/04* (2013.01); *H03B 5/32* (2013.01)

(58) Field of Classification Search
CPC ...................................................... H03H 3/02
USPC ............................................................ 331/68
See application file for complete search history.

(56) References Cited

U.S. PATENT DOCUMENTS

| 2012/0216745 A1* | 8/2012 | Mizonobe | ............... H03H 3/02 118/500 |
| 2013/0043960 A1* | 2/2013 | Ishii | ................... H03H 9/0542 29/25.35 |
| 2017/0346442 A1 | 11/2017 | Ito et al. | |

FOREIGN PATENT DOCUMENTS

| JP | H09-162643 A | 6/1997 |
| JP | H11-051802 A | 2/1999 |
| JP | 2010-232974 A | 10/2010 |
| JP | 2017-216551 A | 12/2017 |
| JP | 2018-011140 A | 1/2018 |

* cited by examiner

*Primary Examiner* — Joseph Chang
(74) *Attorney, Agent, or Firm* — Harness, Dickey & Pierce, P.L.C.

(57) ABSTRACT

A resonator device includes: a base including a semiconductor substrate; a resonator element; and a lid to be bonded to the base, the lid and the base forming a cavity for accommodating the resonator element. An integrated circuit is disposed at the semiconductor substrate, the integrated circuit including an oscillation circuit electrically coupled to the resonator element, a memory circuit configured to store a reference value of an output characteristic of the resonator element, and a determination circuit configured to compare a detection value of the output characteristic of the resonator element with the reference value and determine an airtight state inside the cavity based on a comparison result.

13 Claims, 25 Drawing Sheets

FIG. 9
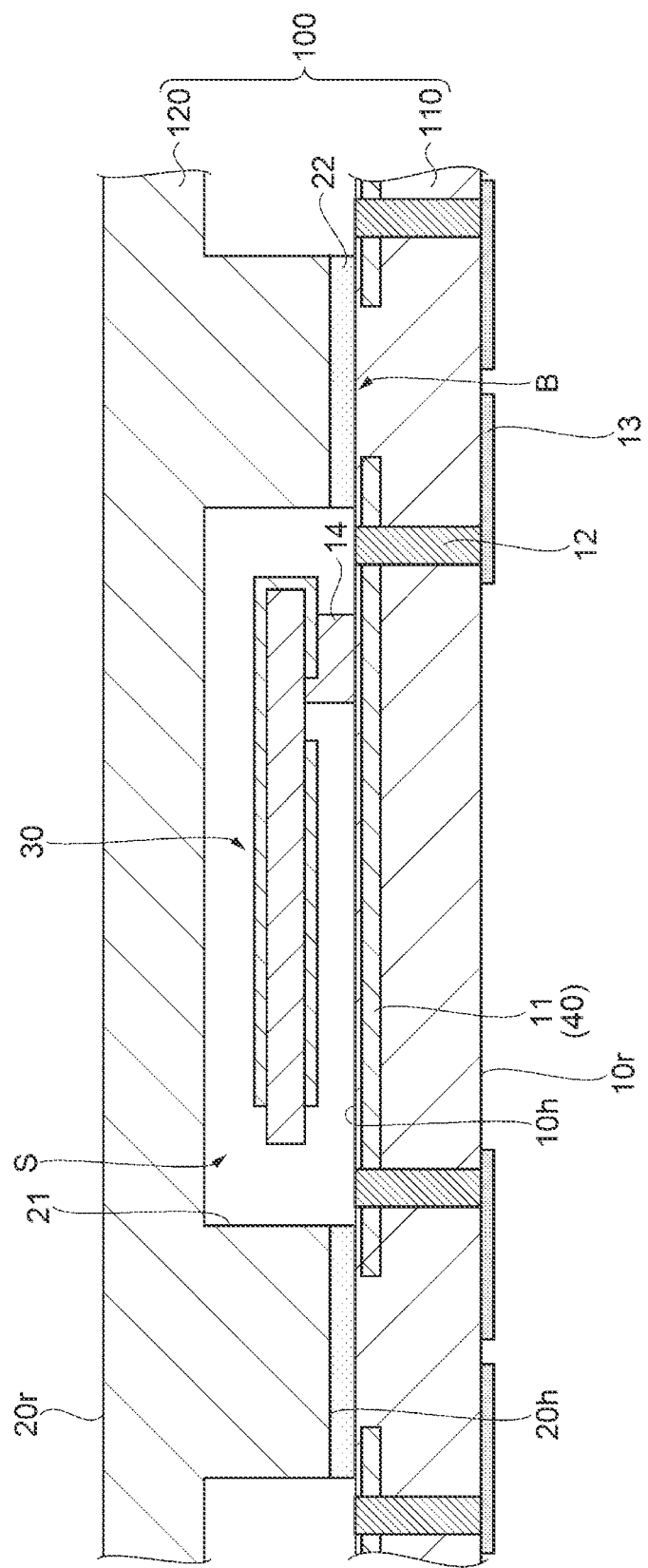
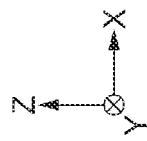

FIG. 10
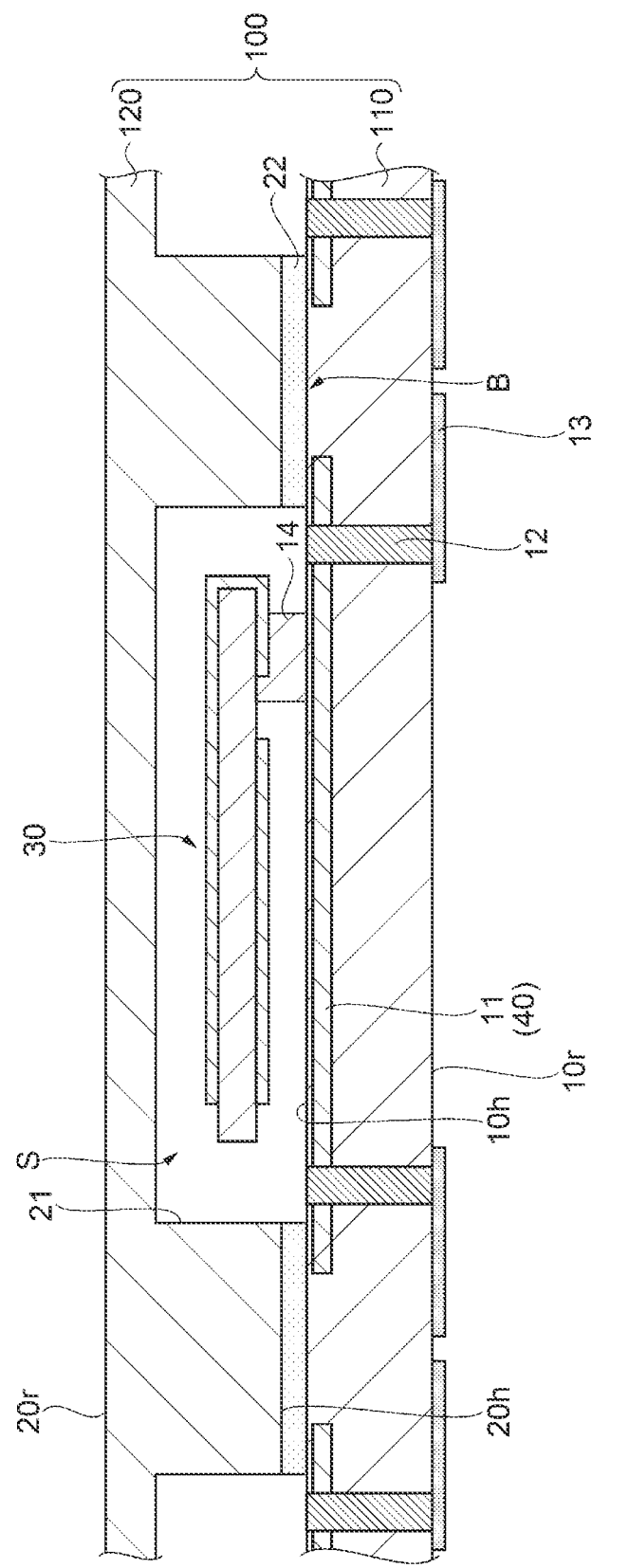
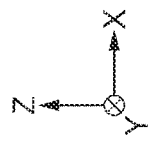

RESONATOR DEVICE AND METHOD FOR MANUFACTURING RESONATOR DEVICE

The present application is based on, and claims priority from JP Application Serial Number 2021-122329, filed Jul. 27, 2021, the disclosure of which is hereby incorporated by reference herein in its entirety.

BACKGROUND

1. Technical Field

The present disclosure relates to a resonator device and a method for manufacturing a resonator device.

2. Related Art

For example, in JP-A-11-51802, as a method for inspecting airtightness of a package in which a piezoelectric element is accommodated, a pressure around the package is changed, and presence or absence of a change in pressure inside the package is captured as a change in impedance of the piezoelectric element along with the change in pressure inside the package. That is, a method for inspecting airtightness of a package based on a difference between impedance of the piezoelectric element before pressure reduction and impedance of the piezoelectric element after pressure reduction is disclosed.

However, in the inspection method described in JP-A-11-51802, the impedance of the piezoelectric element needs to be measured before and after pressure reduction, and thus a pressure reducing device, an impedance measuring device, and the like are required. In addition, there are problems that the number of inspection man-hours increases and manufacturing costs increase.

SUMMARY

A resonator device includes: a base including a semiconductor substrate having a first surface and a second surface in a front-back relationship with each other; a resonator element disposed at the first surface side; and a lid to be bonded to the first surface of the base, the lid and the base forming a cavity for accommodating the resonator element. An integrated circuit is disposed at the semiconductor substrate, the integrated circuit including an oscillation circuit electrically coupled to the resonator element, a memory circuit configured to store a reference value of an output characteristic of the resonator element, and a determination circuit configured to compare a detection value of the output characteristic of the resonator element with the reference value and determine an airtight state inside the cavity based on a comparison result.

A method for manufacturing a resonator device is a method for manufacturing a resonator device including a base, a resonator element, and a lid forming a cavity for accommodating the resonator element with the base, and the method includes: preparing a base wafer having a first surface and a second surface in a front-back relationship with each other and including a plurality of dicing regions; disposing the resonator element at the first surface side of the base wafer for each of the dicing regions; preparing a lid wafer including a plurality of the dicing regions, and bonding the lid wafer to the first surface of the base wafer to obtain a device wafer formed with the cavity for accommodating the resonator element for each of the dicing regions; forming a bottomed first groove in a boundary portion between adjacent dicing regions of the device wafer such that a bonding portion between the lid wafer and the base wafer is exposed; inspecting an airtight state inside the cavity for each of the dicing regions; and forming a second groove penetrating the device wafer in the boundary portion where the first groove is formed, and dicing the device wafer for each of the dicing regions to obtain a plurality of the resonator devices.

A method for manufacturing a resonator device is a method for manufacturing a resonator device including a base, a resonator element, and a lid forming a cavity for accommodating the resonator element with the base, and the method includes: preparing a base wafer having a first surface and a second surface in a front-back relationship with each other and including a plurality of dicing regions; disposing the resonator element at the first surface side of the base wafer for each of the dicing regions; preparing a lid wafer having a third surface and a fourth surface in a front-back relationship with each other, including a plurality of the dicing regions, and formed with a bottomed first groove in a boundary portion between adjacent dicing regions at the third surface, and bonding the third surface of the lid wafer to the first surface of the base wafer to obtain a device wafer formed with the cavity for accommodating the resonator element for each of the dicing regions; forming a second groove penetrating from the base wafer side to the first groove in the boundary portion between adjacent dicing regions of the device wafer; inspecting an airtight state inside the cavity for each of the dicing regions; and thinning the fourth surface of the lid wafer, and dicing the device wafer for each of the dicing regions to obtain a plurality of the resonator devices.

A method for manufacturing a resonator device is a method for manufacturing a resonator device including a base, a resonator element, and a lid forming a cavity for accommodating the resonator element with the base, and the method includes: preparing a base wafer having a first surface and a second surface in a front-back relationship with each other and including a plurality of dicing regions; disposing the resonator element at the first surface side of the base wafer for each of the dicing regions; preparing a lid wafer having a third surface and a fourth surface in a front-back relationship with each other, including a plurality of the dicing regions, and formed with a bottomed first groove in a boundary portion between adjacent dicing regions at the third surface, and bonding the third surface of the lid wafer to the first surface of the base wafer to obtain a device wafer formed with the cavity for accommodating the resonator element for each of the dicing regions; thinning the fourth surface of the lid wafer to expose the first groove to the lid wafer side; inspecting an airtight state inside the cavity for each of the dicing regions; and forming a second groove penetrating from the base wafer side to the first groove in the boundary portion between adjacent dicing regions of the device wafer, and dicing the device wafer for each of the dicing regions to obtain a plurality of the resonator devices.

BRIEF DESCRIPTION OF THE DRAWINGS

FIG. 9 is a cross-sectional view showing the method for manufacturing a resonator device.

FIG. 10 is a cross-sectional view showing the method for manufacturing a resonator device.

DESCRIPTION OF EXEMPLARY EMBODIMENTS

1. First Embodiment 1.1. Resonator Device

First, as an example of a resonator device 1 according to a first embodiment, an oscillator including a resonator element 30 and an oscillation circuit 41 will be described with reference to FIGS. 1, 2, and 3.

Figure 1:
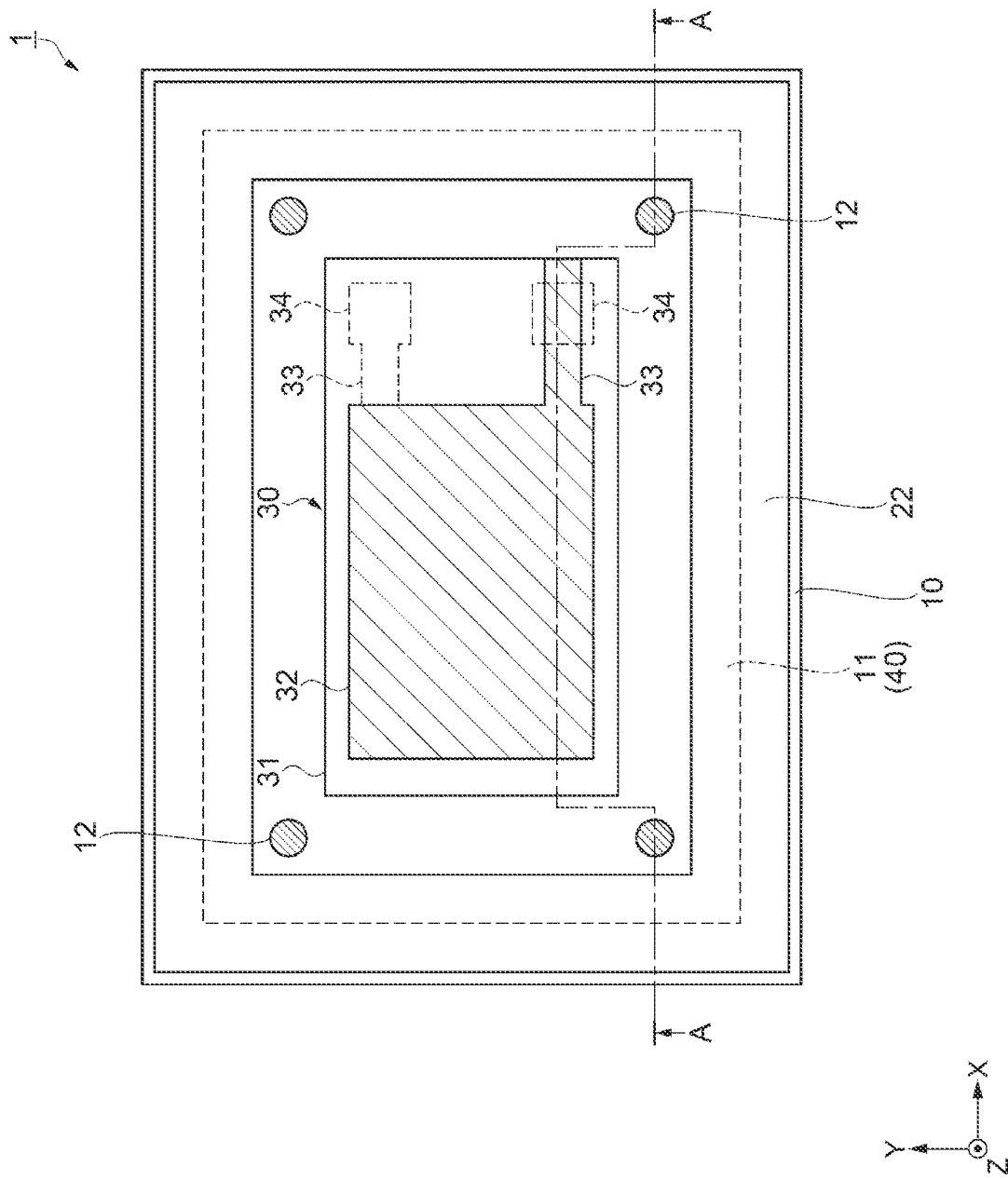
FIG. 1 is a plan view showing a schematic structure of a resonator device according to a first embodiment.

For convenience of describing an internal configuration of the resonator device 1, FIG. 1 shows a state in which a lid 20 is removed. For convenience of description, an X axis, a Y axis, and a Z axis are shown as three axes orthogonal to one another in the following plan views and cross-sectional views. A direction along the X axis is referred to as an "X direction", a direction along the Y axis is referred to as a "Y direction", and a direction along the Z axis is referred to as a "Z direction". In addition, an arrow side of each axis is also referred to as a "plus side", and a side opposite to the arrow side is also referred to as a "minus side". A plus side in the Z direction is also referred to as "upper", and a minus side in the Z direction is also referred to as "lower".

Figure 2:
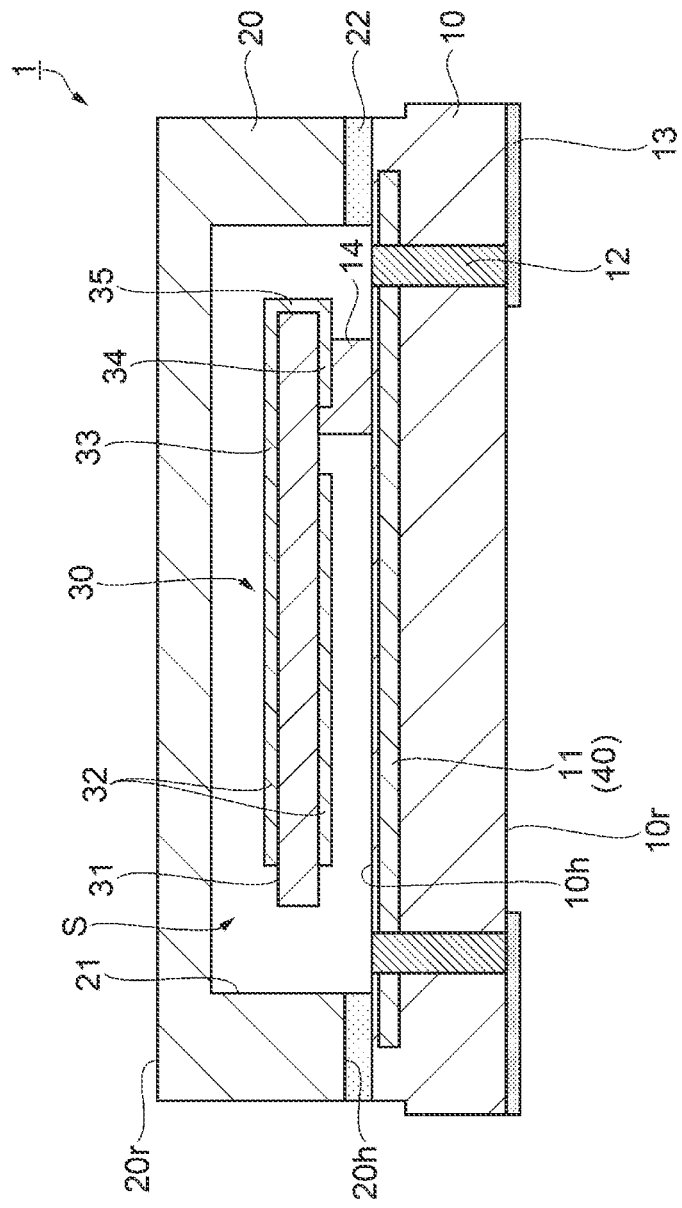
FIG. 2 is a cross-sectional view taken along a line A-A in FIG. 1.

As shown in FIGS. 1 and 2, the resonator device 1 includes a base 10, the lid 20, and the resonator element 30.

The base 10 is a rectangular flat plate in a plan view from the Z direction. The base 10 includes a first surface 10h and a second surface 10r in a front-back relationship with each other, and includes a semiconductor substrate 11 at the first surface 10h side. The base 10 is provided with a plurality of through electrodes 12 penetrating the first surface 10h, the second surface 10r, and the semiconductor substrate 11, and the semiconductor substrate 11 is electrically coupled to external terminals 13 formed at the second surface 10r. The through electrodes 12 are disposed at an inner side of the semiconductor substrate 11 in a plan view from the Z direction.

Figure 3:
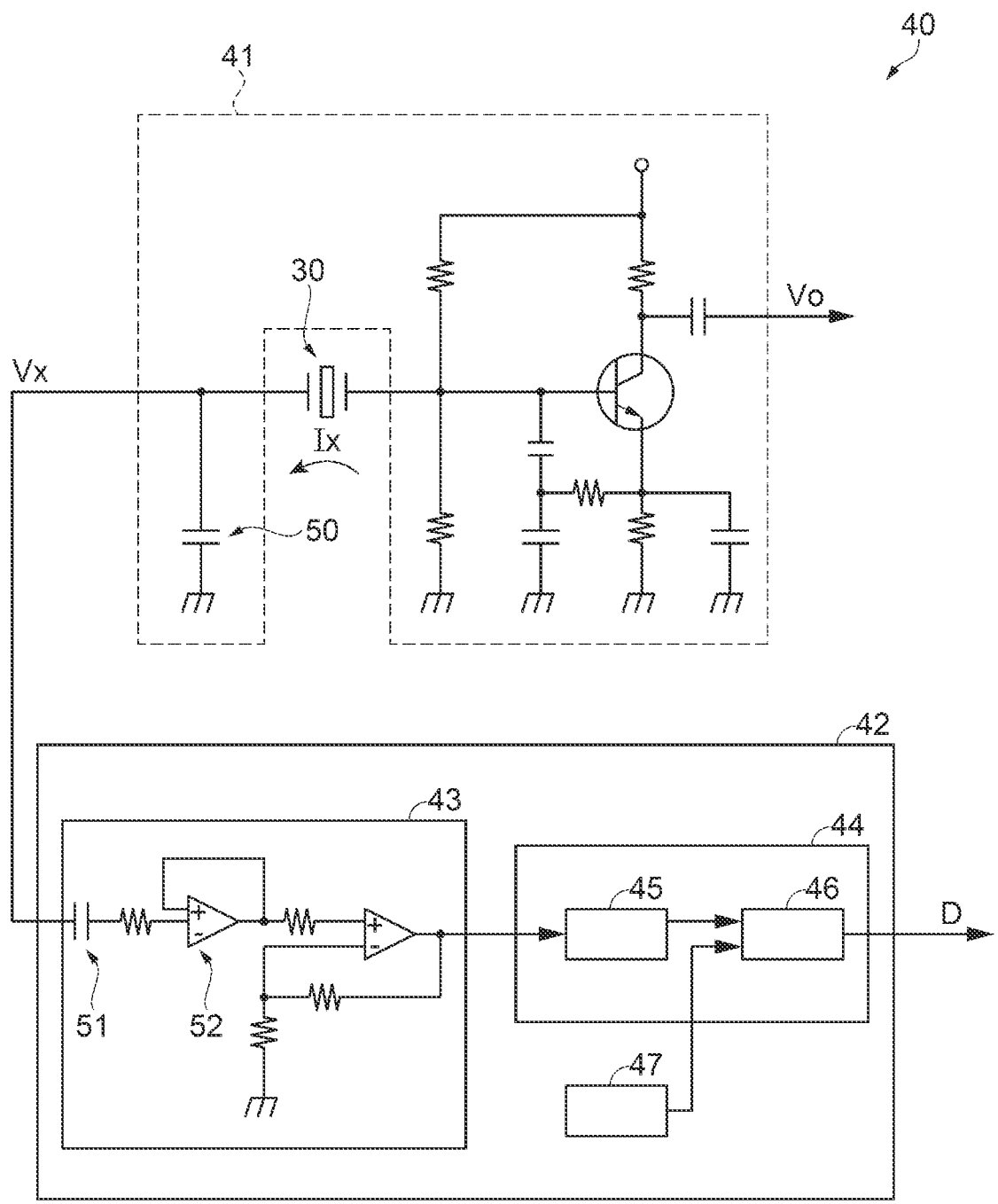
FIG. 3 is a diagram showing a schematic configuration of an integrated circuit included in the resonator device according to the first embodiment.

An integrated circuit 40 is disposed at the semiconductor substrate 11, and as shown in FIG. 3, the integrated circuit 40 includes the oscillation circuit 41 electrically coupled to the resonator element 30, a memory circuit 47 that stores a reference value of an output characteristic of the resonator element 30, and a determination circuit 42 that compares a detection value of the output characteristic of the resonator element 30 with the reference value and determines an airtight state inside a cavity S based on a comparison result. In addition, constituent materials of the base 10 are preferably a silicon substrate, and a glass substrate, a ceramic substrate, or the like may be used.

The lid 20 has a rectangular shape in a plan view from the Z direction, includes a third surface 20h and a fourth surface 20r in a front-back relationship with each other, and is formed with a recessed portion 21 recessed from the third surface 20h toward the fourth surface 20r side. The lid 20 is bonded to the first surface 10h of the base 10 via a bonding member 22, and constitutes the cavity S for accommodating the resonator element 30 with the base 10. An inside of the cavity S is in a pressure-reduced state, preferably in a near-vacuum state. As a result, viscous resistance is reduced, and oscillation characteristics of the resonator element 30 are improved. In addition, constituent materials of the lid 20 are preferably a silicon substrate, and a glass substrate, a ceramic substrate, or the like may be used.

The base 10 and the lid 20 are bonded using an activation bonding method in which a surface of the first surface 10h of the base 10 and a surface of the bonding member 22, which is a metal film of Au or the like formed at the third surface 20h of the lid 20, are activated by plasma irradiation. The bonding method is not limited thereto, and may be a metal eutectic bonding method, a thermocompression bonding method, or an atomic diffusion bonding method for bonding metal films formed at the first surface 10h of the base 10 and the third surface 20h of the lid 20 to each other, a bonding method via glass frit or the like, or a silicon-silicon room-temperature direct bonding method.

The resonator element 30 includes a resonator substrate 31, an excitation electrode 32 that resonates the resonator substrate 31, an electrode pad 34 that outputs a resonator signal to an outside and fixes the resonator element 30 to the base 10, lead electrodes 33 that electrically couple the excitation electrode 32 and the electrode pad 34, and a side surface electrode 35 that electrically couples the lead electrodes 33 formed at front and back sides of the resonator substrate 31.

The resonator element 30 is disposed at the first surface 10h side of the base 10, and is bonded to the base 10 via a bonding member 14 such as a gold bump at a portion of the electrode pad 34. As the resonator substrate 31, an AT-cut crystal substrate, an SC-cut crystal substrate, a BT-cut crystal substrate, or the like is used.

Next, a principle of leak detection in the resonator device 1 according to the present embodiment will be described in detail with reference to FIG. 3.

The resonator element 30 is replaced with equivalent resistance. When oscillation is started by the oscillation circuit 41, which is a Colpitts oscillation circuit using a transistor, a current Ix flows from the resonator element 30 toward ground. The current Ix flowing through the resonator element 30 decreases in inverse proportion to a magnitude of the equivalent resistance of the resonator element 30.

It is known that the equivalent resistance of the resonator element 30 is increased by one to two digits of magnitude in the air than in the vacuum due to an influence of air resistance. Since the inside of the cavity S for accommodating the resonator element 30 is generally in a vacuum state, when leakage occurs, the equivalent resistance of the resonator element 30 changes in a direction in which the equivalent resistance increases. Therefore, in the resonator device 1 according to the present embodiment, it is possible to monitor whether airtightness of the resonator device 1 is maintained by monitoring a change in the current Ix flowing through the resonator element 30.

If determination is made based on an output voltage Vo of the resonator device 1, the output voltage Vo as an oscillation frequency signal of the resonator device 1 is saturated, and thus the output voltage Vo of the resonator device 1 does not change even when the current Ix flowing through the resonator element 30 changes in units of µA. However, when the current Ix flowing through the resonator element 30 changes, an output voltage Vx serving as the output characteristic of the resonator element 30 changes. The output characteristic of the resonator element 30 is the output voltage Vx of the resonator element 30.

Therefore, the determination circuit 42 can determine whether the airtightness of the resonator device 1 is maintained based on the output voltage Vx of the resonator element 30.

Here, when capacitance of a capacitive element 50 coupled to the resonator element 30 is set as C1, the output voltage Vx of the resonator element 30 is observed as $Vx = Ix \times (1/\omega C1)$.

Therefore, based on a change in an absolute value of the output voltage Vx, the determination circuit 42 can obtain a degree of leakage by observing the output voltage Vx at regular intervals and obtaining an inclination of the change, and output the degree as a determination result.

The determination circuit 42 includes a determination voltage generation circuit 43 and a voltage determination circuit 44. The determination voltage generation circuit 43 outputs a determination voltage corresponding to a magnitude of the output voltage Vx of the resonator element 30. The determination voltage generation circuit 43 includes a capacitive element 51 and an operational amplifier 52, and the capacitive element 51 cuts a DC component output by the resonator element 30. Accordingly, an AC component of the output voltage Vx of the resonator element 30 is input to the operational amplifier 52 implemented by a voltage follower circuit. Therefore, the determination voltage generation circuit 43 extracts the AC component included in the output voltage Vx of the resonator element 30 and outputs the AC component as the determination voltage. Here, as described above, it is possible to prevent interference between the oscillation circuit 41 or the resonator element 30 and the voltage determination circuit 44 by coupling the operational amplifier 52 having large input impedance to an output side of the resonator element 30. Therefore, the voltage determination circuit 44 can more accurately determine the airtight state without affecting an oscillation state of the resonator element 30.

The voltage determination circuit 44 determines whether the airtightness of the resonator device 1 is maintained based on the determination voltage output from the determination voltage generation circuit 43. The voltage determination circuit 44 includes a rectifier circuit 45 and a comparator circuit 46, and the rectifier circuit 45 is a circuit that converts an AC voltage output as the determination voltage into a DC voltage. The rectifier circuit 45 may include a smoothing circuit that smoothens a pulsating current included in an output of a half-wave rectifier circuit or a full-wave rectifier circuit.

The comparator circuit 46 compares an output of the rectifier circuit 45, which is the detection value of the output characteristic of the resonator element 30, with a reference voltage as a reference value stored in the memory circuit 47, and outputs a comparison result D.

As described above, the resonator device 1 according to the present embodiment includes the determination circuit 42 that compares the output voltage Vx, which is the detection value of the output characteristic of the resonator element 30, with the reference voltage serving as the reference value, and determines the airtight state inside the cavity S based on the comparison result, and thus the airtight state can be more accurately determined without affecting the oscillation state of the resonator element 30. Therefore, a pressure reducing device, an impedance measuring device, and the like are not required, and the number of inspection man-hours and manufacturing costs can be reduced. In addition, since leakage determination can be performed by the resonator device 1 alone, leakage inspection can also be performed after mounting or an environmental test.

1.2. Method for Manufacturing Resonator Device

Next, a method for manufacturing the resonator device 1 according to the present embodiment will be described with reference to FIGS. 4 to 12.

Figure 4:
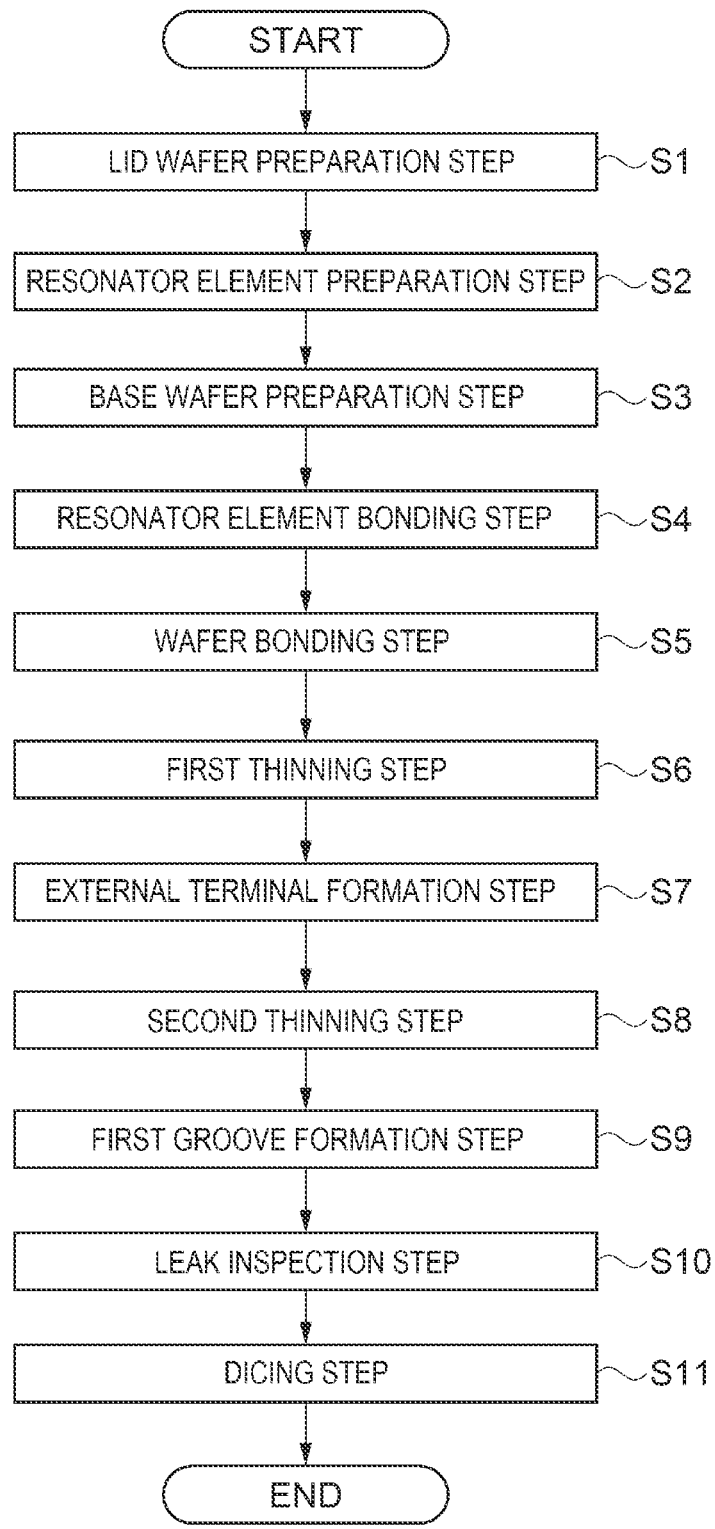
FIG. 4 is a flowchart showing a method for manufacturing a resonator device according to the first embodiment.

As shown in FIG. 4, the method for manufacturing the resonator device 1 according to the present embodiment includes a lid wafer preparation step, a resonator element preparation step, a base wafer preparation step, a resonator element bonding step, a wafer bonding step, a first thinning step, an external terminal formation step, a second thinning step, a first groove formation step, a leak inspection step, and a dicing step.

1.2.1. Lid Wafer Preparation Step

Figure 5:
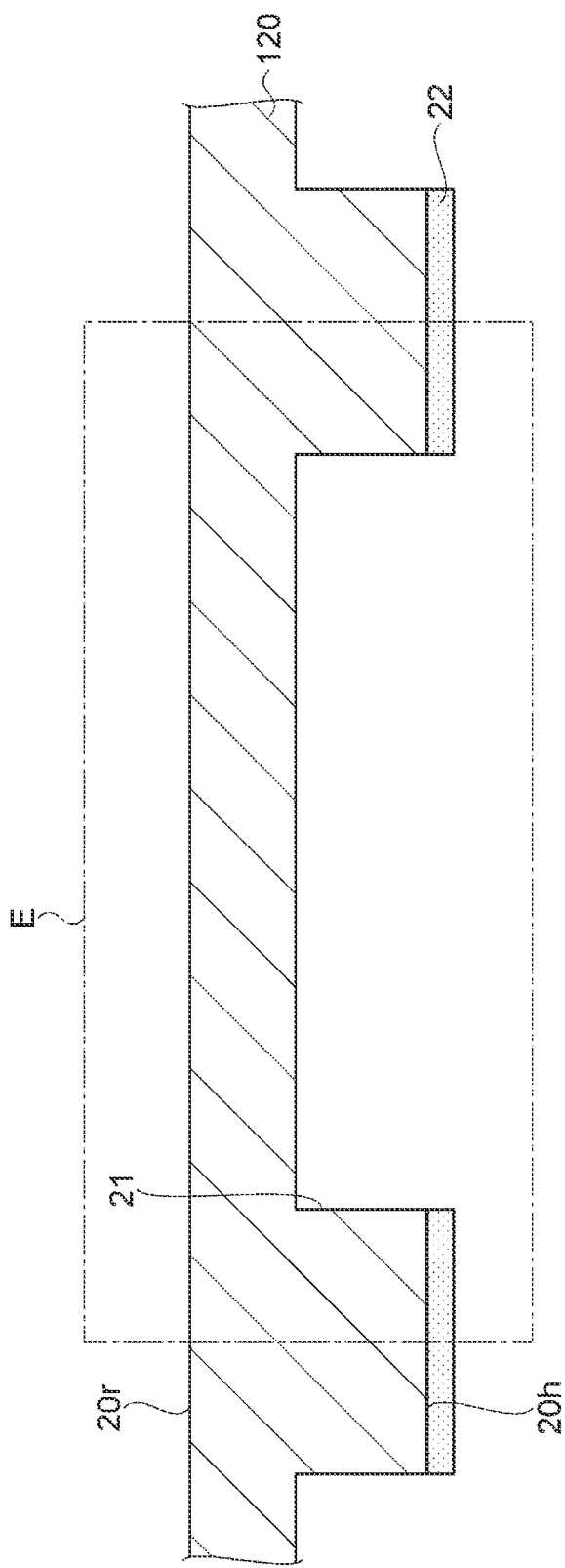
FIG. 5 is a cross-sectional view showing the method for manufacturing a resonator device.

First, in step S1, in order to manufacture a plurality of resonator devices 1 at the same time, as shown in FIG. 5, a large plate-shaped lid wafer 120 including the third surface 20h and the fourth surface 20r in a front-back relationship with each other and including a plurality of dicing regions E is prepared. In the plurality of dicing regions E of the lid wafer 120, the recessed portion 21 recessed from the third surface 20h toward the fourth surface 20r side is formed by a photolithography technique and an etching technique. A metal film serving as the bonding member 22 is formed at the third surface 20h of the lid wafer 120 by a sputtering method or the like. The lid wafer 120 is a silicon substrate, and is finally diced to become the lid 20.

1.2.2. Resonator Element Preparation Step

In step S2, as shown in FIGS. 1 and 2, the resonator element 30 is prepared, in which the excitation electrode 32, the lead electrodes 33, the electrode pad 34, and the like are formed on the resonator substrate 31.

1.2.3. Base Wafer Preparation Step

Figure 6:
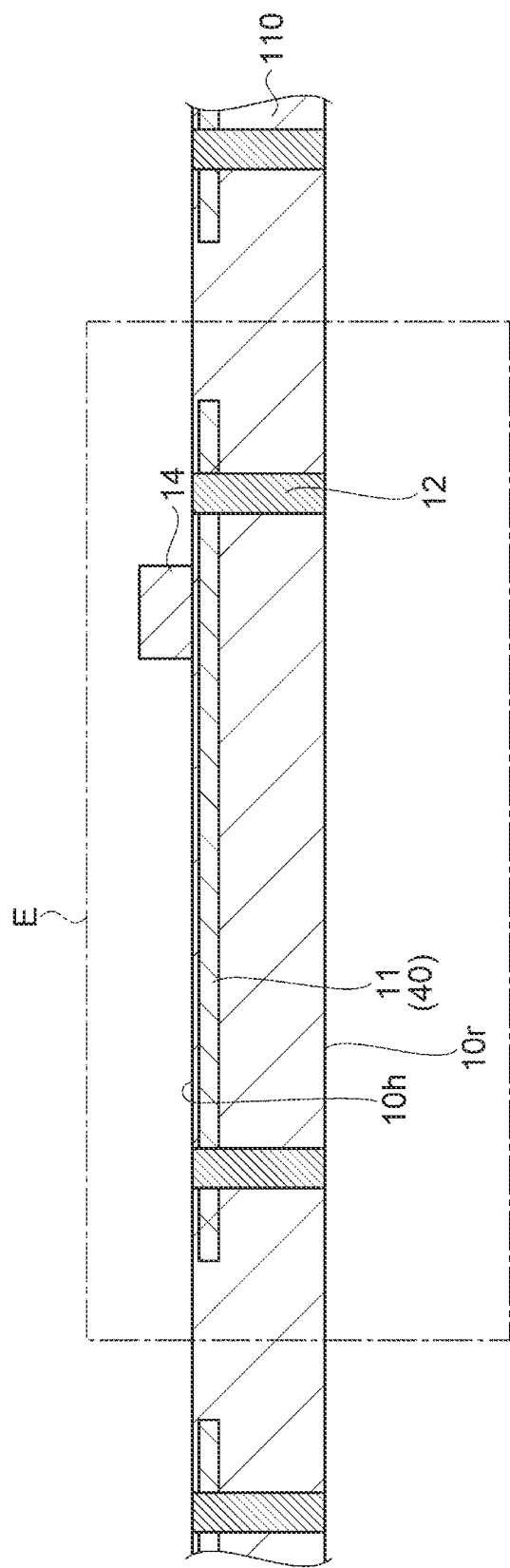
FIG. 6 is a cross-sectional view showing the method for manufacturing a resonator device.

In step S3, as shown in FIG. 6, a large plate-shaped base wafer 110 including the first surface 10h and the second surface 10r in a front-back relationship with each other and including a plurality of dicing regions E is prepared. In the plurality of dicing regions E of the base wafer 110, the semiconductor substrate 11 at which the integrated circuit 40 is disposed, and a plurality of through electrodes 12 penetrating the first surface 10h, the second surface 10r, and the semiconductor substrate 11 are provided, and the bonding member 14 such as a gold bump for fixing the resonator element 30 is formed on the semiconductor substrate 11. In addition, the integrated circuit 40 includes the oscillation circuit 41 electrically coupled to the resonator element 30 and the determination circuit 42 that determines the airtight state inside the cavity S. Further, the base wafer 110 is a silicon substrate, and is finally diced to form the base 10.

1.2.4. Resonator Element Bonding Step

Figure 7:
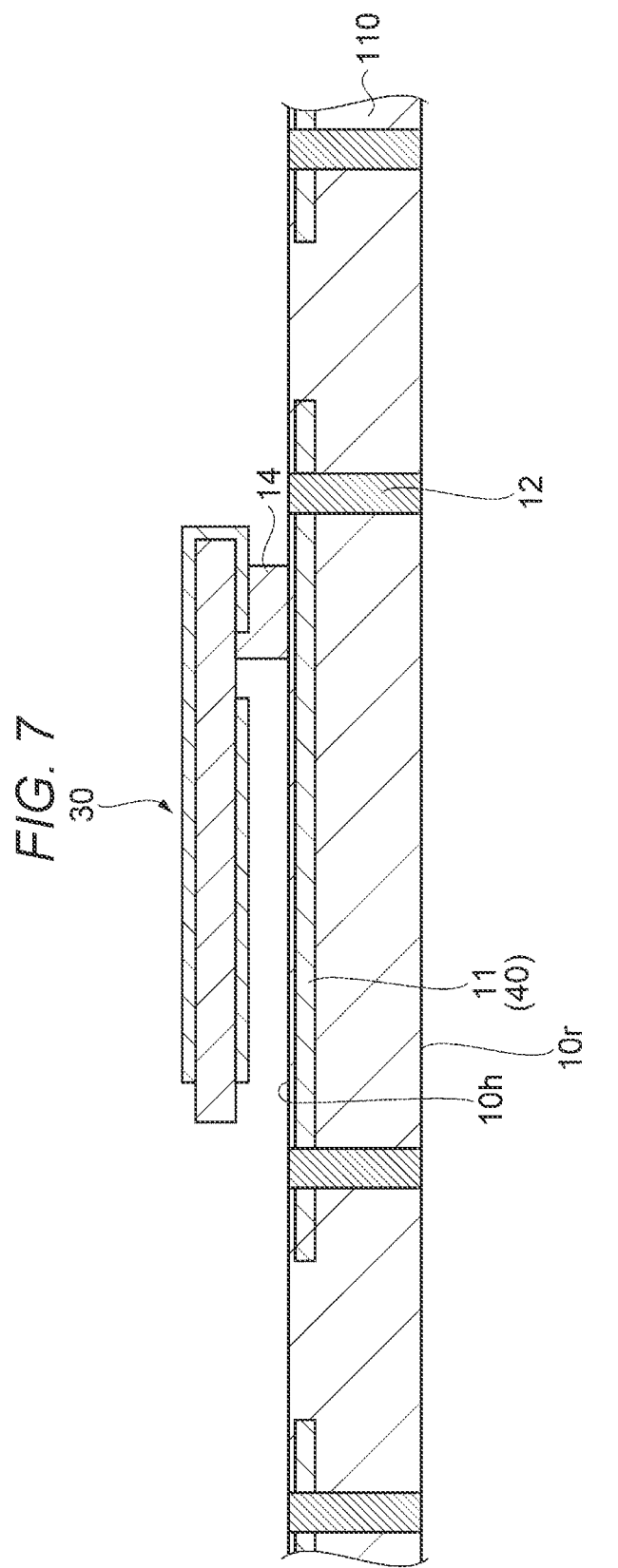
FIG. 7 is a cross-sectional view showing the method for manufacturing a resonator device.

In step S4, as shown in FIG. 7, the resonator element 30 is disposed on the bonding member 14, which is formed on the base wafer 110, at the first surface 10h side of the base wafer 110, and the resonator element 30 is bonded using thermocompression in combination with ultrasonic vibration.

1.2.5. Wafer Bonding Step

Figure 8:
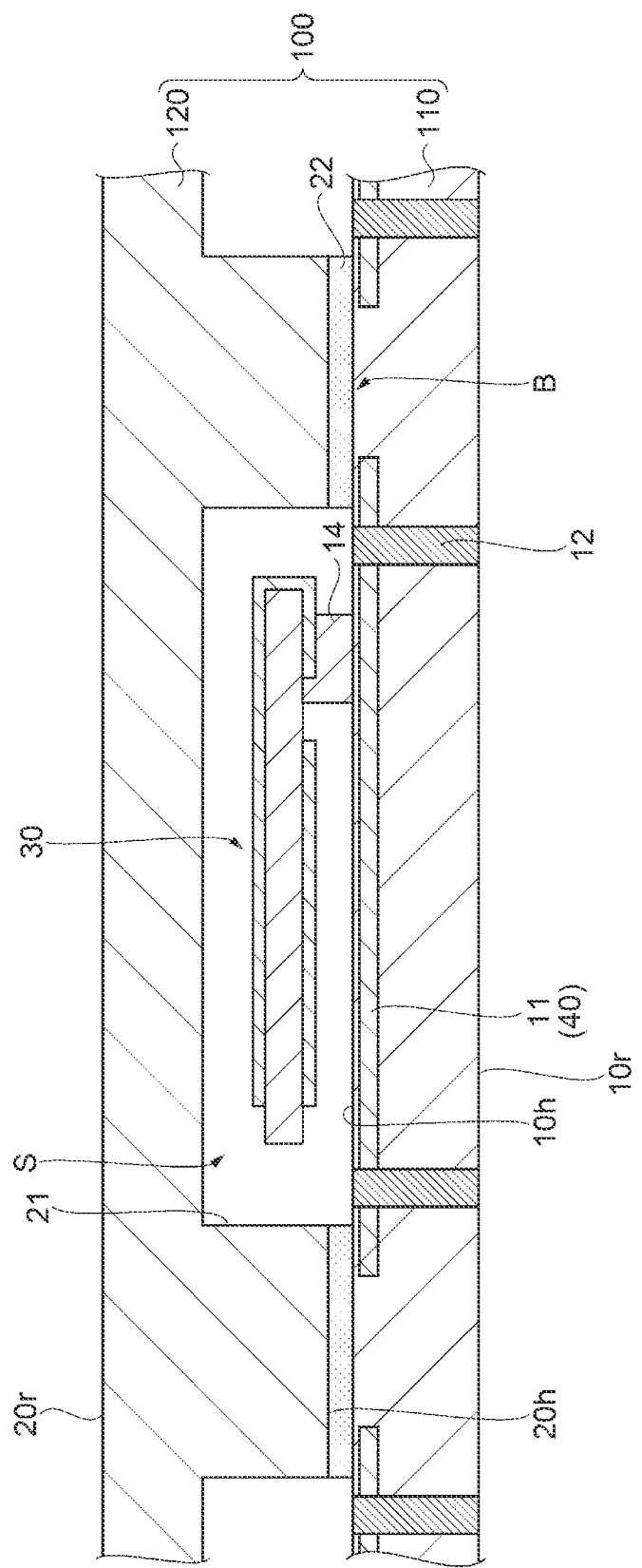
FIG. 8 is a cross-sectional view showing the method for manufacturing a resonator device.

In step S5, as shown in FIG. 8, after a surface of a region at the first surface 10h of the base wafer 110 to be bonded to the lid wafer 120 and a surface of the bonding member 22 formed at the third surface 20h of the lid wafer 120 are activated by plasma irradiation, the surface of the region of the base wafer 110 to be bonded to the lid wafer 120 and the surface of the bonding member 22 formed at the third surface 20h of the lid wafer 120 are positioned to face each other, and the base wafer 110 and the lid wafer 120 are bonded to each other using the activation bonding method. The base wafer 110 and the lid wafer 120 are bonded in a vacuum chamber, and thus the inside of the cavity S can be in a pressure-reduced state. By bonding the lid wafer 120 to the first surface 10h of the base wafer 110, the cavity S is formed inside the dicing regions E, and a device wafer 100 in which the resonator element 30 is accommodated inside the cavity S is completed. Therefore, this step is a step of obtaining the device wafer 100 in which the cavity S for accommodating the resonator element 30 is formed for each dicing region E. A portion where the surface of the first surface 10h of the base wafer 110 and the surface of the bonding member 22 formed at the third surface 20h of the lid wafer 120 are bonded to each other is a bonding portion B between the base wafer 110 and the lid wafer 120.

1.2.6. First Thinning Step

In step S6, the second surface 10r side of the base wafer 110 is polished by a polishing device or the like to thin the base wafer 110.

1.2.7. External Terminal Formation Step

In step S7, a film of a metal such as Au or Cu is formed on the second surface 10r of the thinned base wafer 110 or on the through electrodes 12 by the sputtering method or the like, and as shown in FIG. 9, the external terminals 13 electrically coupled to the through electrodes 12 are formed by the photolithography technique and the etching technique.

1.2.8. Second Thinning Step

In step S8, as shown in FIG. 10, the fourth surface 20r side of the lid wafer 120 is polished by the polishing device or the like to thin the lid wafer 120.

1.2.9. First Groove Formation Step

Figure 11:
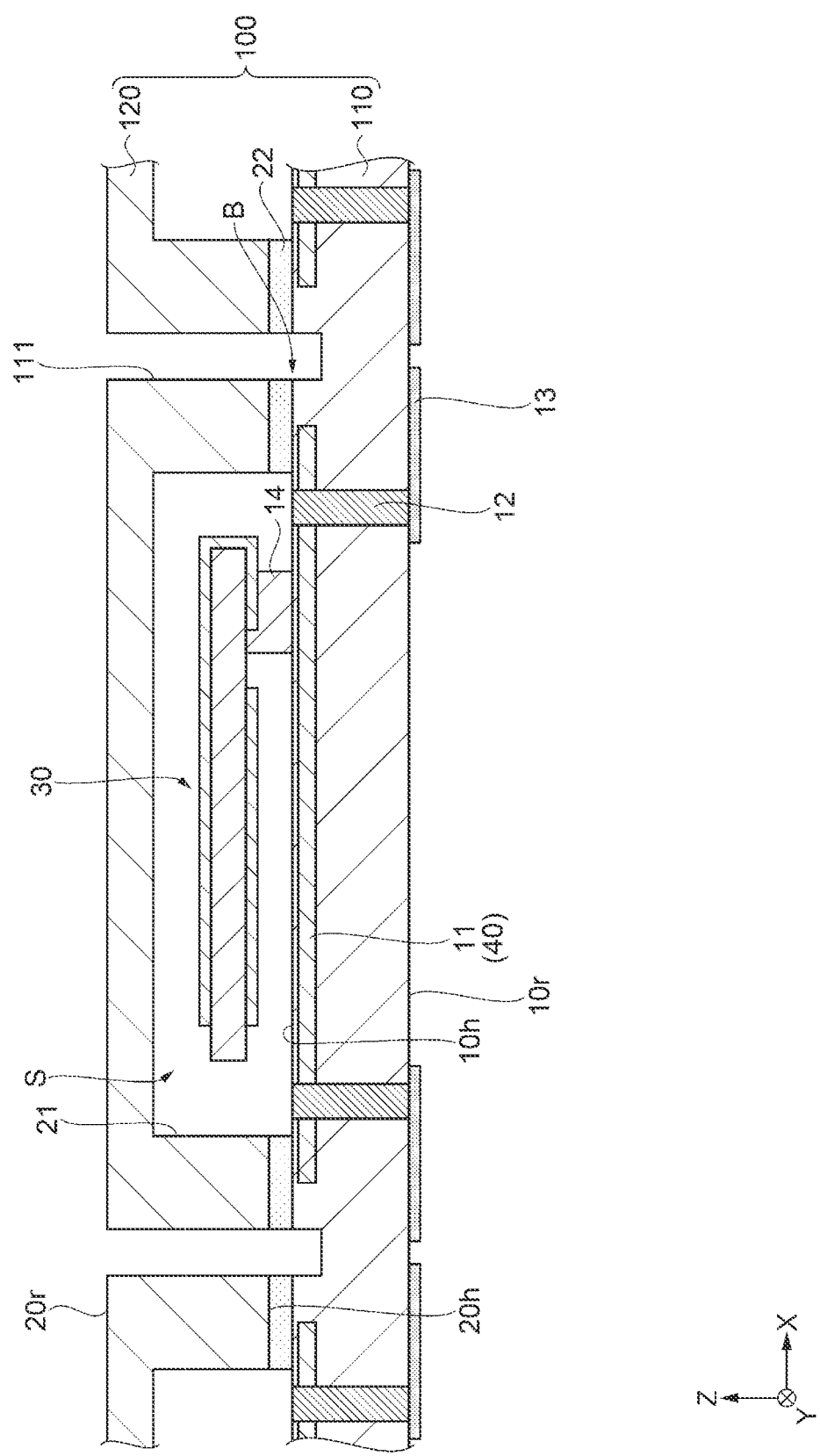
FIG. 11 is a cross-sectional view showing the method for manufacturing a resonator device.

In step S9, as shown in FIG. 11, a bottomed first groove 111 is formed in a boundary portion between adjacent dicing regions E of the device wafer 100 from the lid wafer 120 side using a dicing saw or the like such that the bonding portion B between the lid wafer 120 and the base wafer 110 is exposed.

1.2.10. Leak Inspection Step

In step S10, since the bonding portion B between the lid wafer 120 and the base wafer 110 is exposed by forming the first groove 111, the airtight state inside the cavity S is inspected for each dicing region E.

1.2.11. Dicing Step

Figure 12:
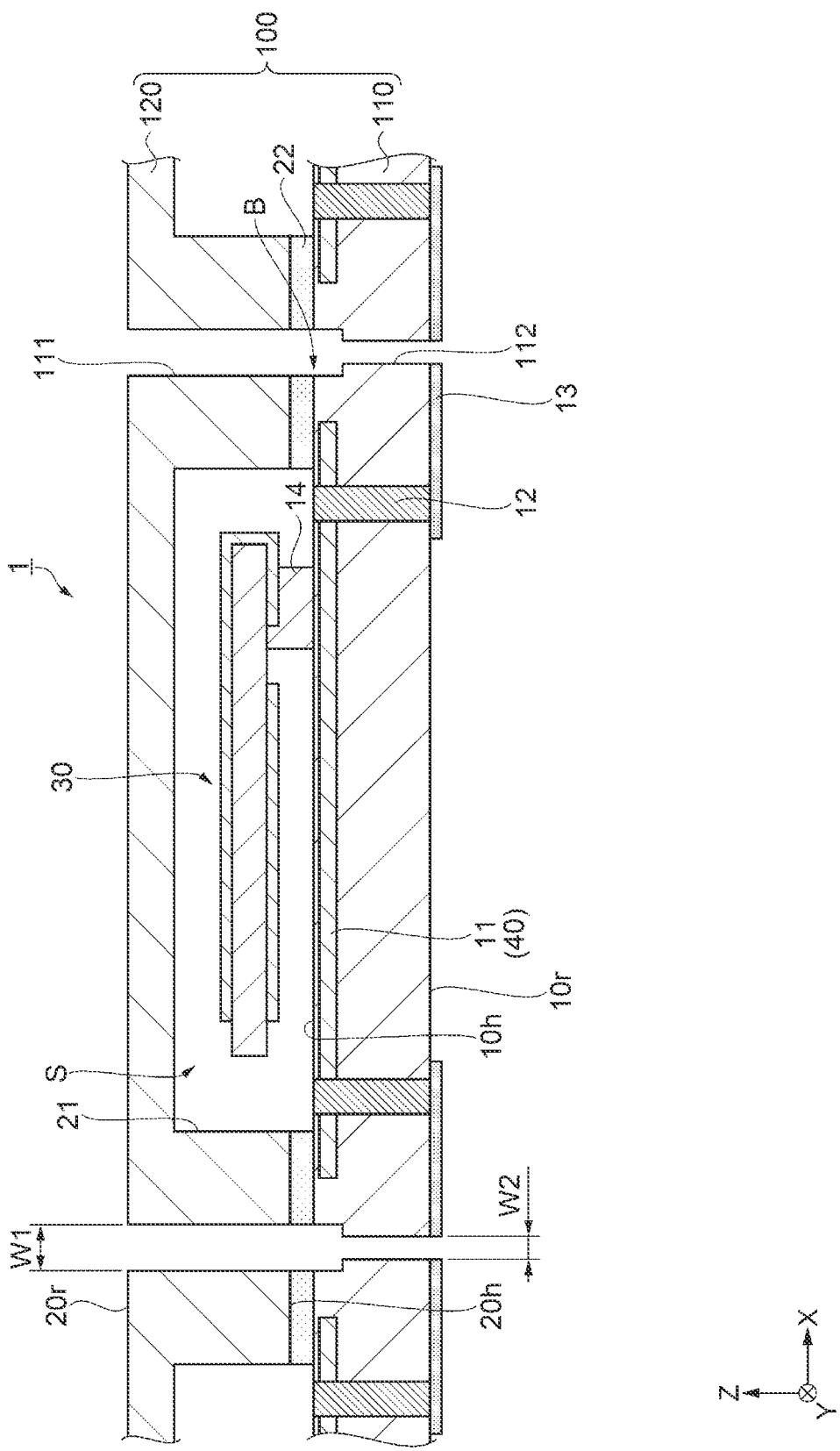
FIG. 12 is a cross-sectional view showing the method for manufacturing a resonator device.

In step S11, as shown in FIG. 12, a second groove 112 penetrating the device wafer 100 from the base wafer 110 side is formed using the dicing saw or the like. By forming the second groove 112, it is possible to dice the device wafer 100 for each dicing region E to obtain a plurality of resonator devices 1. Therefore, this step is a step of forming the second groove 112 penetrating the device wafer 100 in the boundary portion formed with the first groove 111, and dicing the device wafer 100 for each dicing region E to obtain the plurality of resonator devices 1. A width W2 of the second groove 112 is narrower than a width W1 of the first groove 111. Therefore, dicing of the bonding portion B exposed by the first groove 111 can be avoided.

As described above, according to the method for manufacturing the resonator device 1 of the present embodiment, the bonding portion B between the lid wafer 120 and the base wafer 110, which is a leakage factor, is exposed by forming the bottomed first groove 111 in the boundary portion between adjacent dicing regions E of the device wafer 100, and the leak inspection can be performed in a wafer state, so that inspection is facilitated. Therefore, costs of the resonator device 1 can be reduced.

2. Second Embodiment

Next, a resonator device 1a according to a second embodiment will be described with reference to FIGS. 13, 14, and 15.

Figure 14:
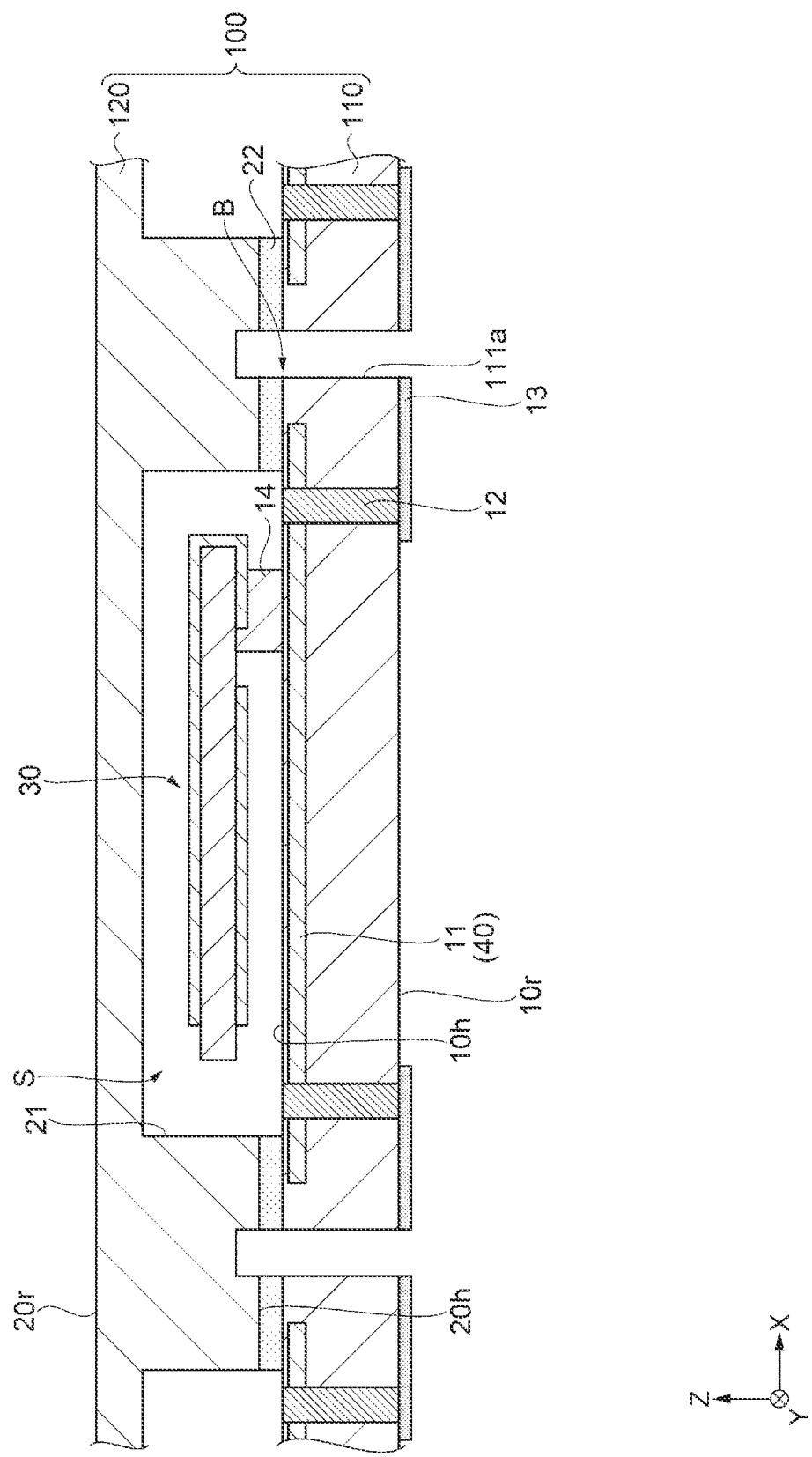
FIG. 14 is a cross-sectional view showing a method for manufacturing a resonator device.
Figure 15:
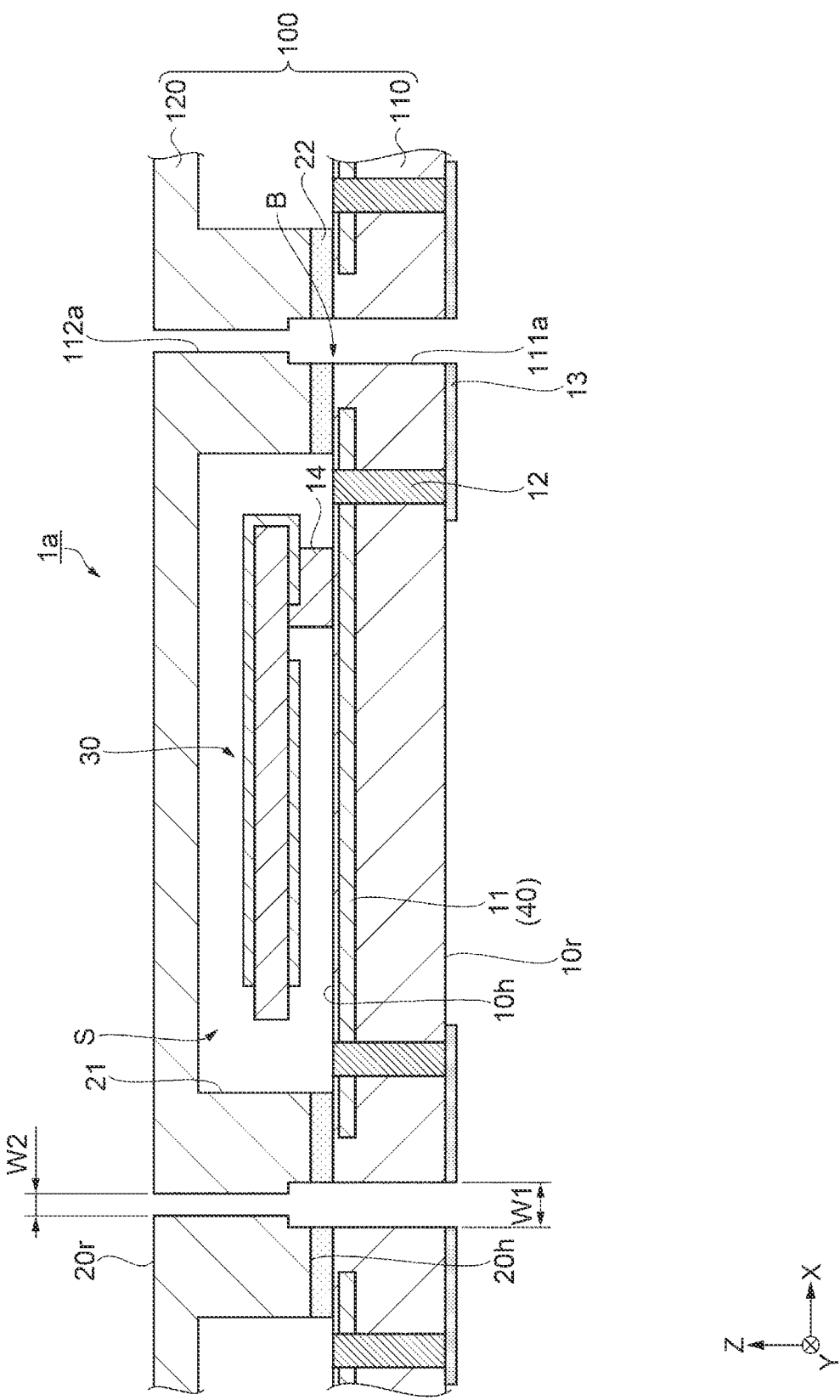
FIG. 15 is a cross-sectional view showing the method for manufacturing a resonator device.

FIG. 14 corresponds to a cross-sectional view showing the first groove formation step of step S9 in the method for manufacturing the resonator device 1 according to the first embodiment, and FIG. 15 corresponds to a cross-sectional view showing the dicing step of step S11 in the method for manufacturing the resonator device 1 according to the first embodiment.

The resonator device 1a according to the present embodiment is the same as the resonator device 1 according to the first embodiment except that structures of a base 10a and a lid 20a are different as compared with the resonator device 1 according to the first embodiment. Differences from the first embodiment described above will be mainly described, the same elements will be denoted by the same reference numerals, and description thereof will be omitted.

Figure 13:
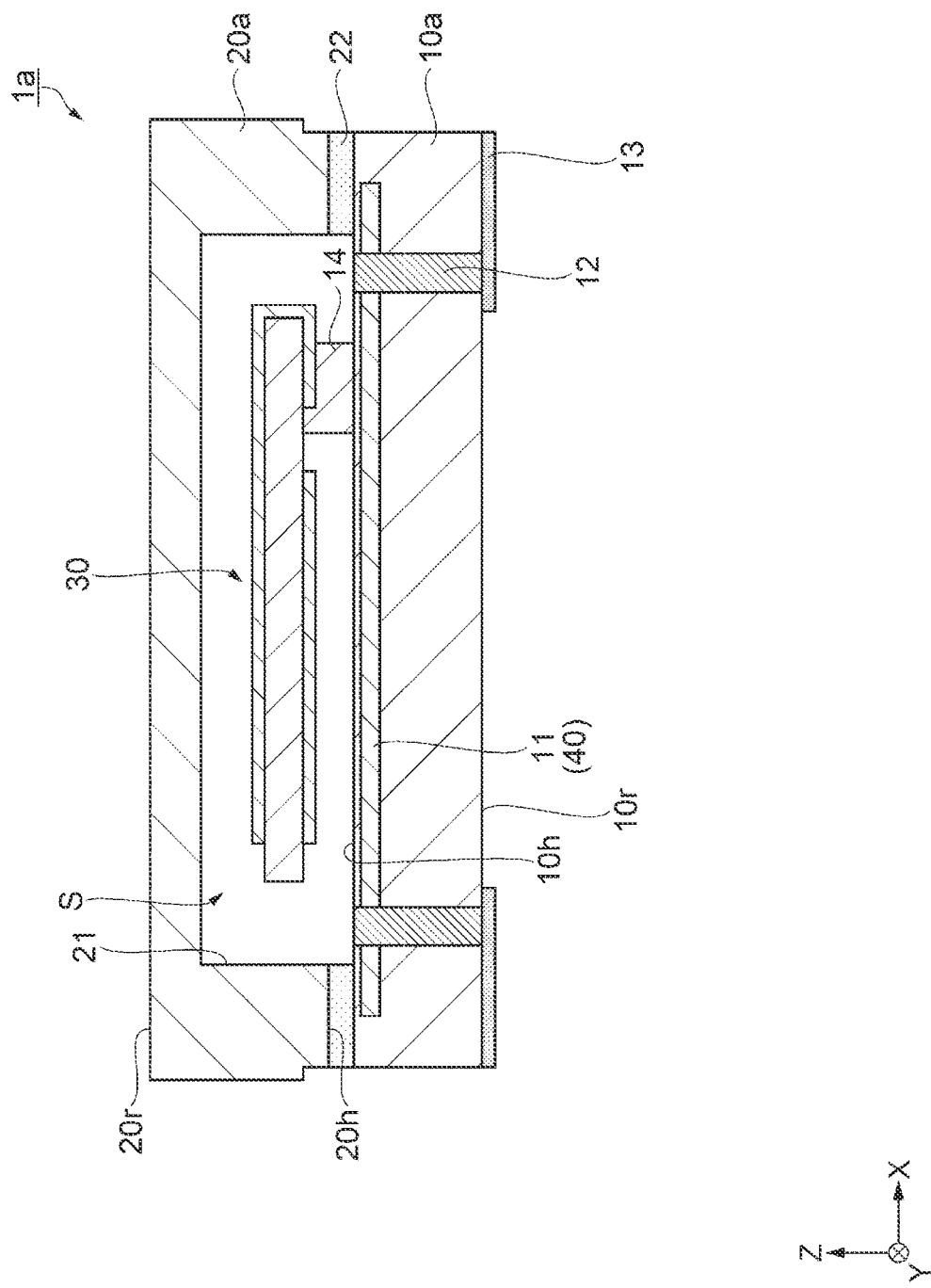
FIG. 13 is a cross-sectional view showing a schematic structure of a resonator device according to a second embodiment.

In the resonator device 1a, as shown in FIG. 13, a length of the base 10a in the X direction is shorter than a length of the lid 20a in the X direction. A portion of the lid 20a at the third surface 20h side has a length in the X direction the same as the length of the base 10a in the X direction. In addition, although not shown, regarding the Y direction of the resonator device 1a, also similarly to the X direction, a length of the base 10a in the Y direction is shorter than a length of the lid 20a in the Y direction. This structure is caused by a method for manufacturing the resonator device 1a.

The method for manufacturing the resonator device 1a has the same number of steps as the method for manufacturing the resonator device 1 according to the first embodiment, but has different operation contents in the first groove formation step of step S9 and the dicing step of step S11.

In the first groove formation step of step S9 in the method for manufacturing the resonator device 1a, as shown in FIG. 14, a bottomed first groove 111a is formed in a boundary portion between adjacent dicing regions E of the device wafer 100 from the base wafer 110 side using a dicing saw or the like such that the bonding portion B between the lid wafer 120 and the base wafer 110 is exposed.

In the dicing step of step S11 in the method for manufacturing the resonator device 1a, as shown in FIG. 15, a second groove 112a penetrating the device wafer 100 from the lid wafer 120 side is formed using the dicing saw or the like. A width W2 of the second groove 112a is narrower than a width W1 of the first groove 111a.

The resonator device 1a can be obtained through the above steps.

With such a configuration, it is possible to obtain the same effects as those of the resonator device 1 according to the first embodiment.

In addition, since the external terminals 13 provided at the second surface 10r of the base wafer 110 can be used as alignment marks by forming the first groove 111a from the base wafer 110 side, accuracy of external dimensions of the resonator device 1a can be improved.

3. Third Embodiment

Next, a method for manufacturing a resonator device 1b according to a third embodiment will be described with reference to FIGS. 16 to 20.

The method for manufacturing the resonator device 1b according to the present embodiment is the same as the method for manufacturing the resonator device 1 according to the first embodiment except that operation contents in a lid wafer preparation step of step S101 and a dicing step of step S110 are different as compared with the method for manufacturing the resonator device 1 according to the first embodiment, and the second thinning step of step S8 and the first groove formation step of step S9 are replaced by a second groove formation step of step S108. Differences from the first embodiment described above will be mainly described, the same elements will be denoted by the same reference numerals, and description thereof will be omitted.

Figure 16:
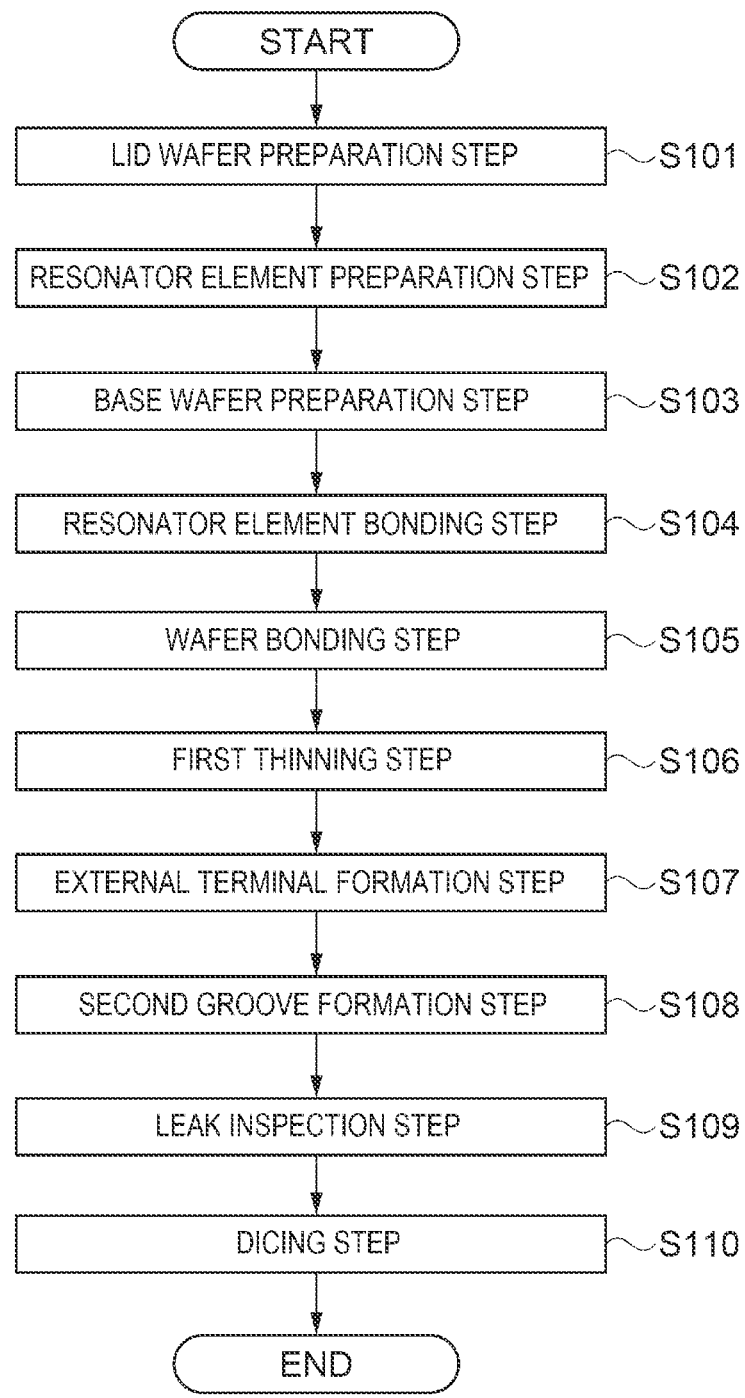
FIG. 16 is a flowchart showing a method for manufacturing a resonator device according to a third embodiment.

As shown in FIG. 16, the method for manufacturing the resonator device 1b according to the present embodiment includes a lid wafer preparation step, a resonator element preparation step, a base wafer preparation step, a resonator element bonding step, a wafer bonding step, a first thinning step, an external terminal formation step, a second groove formation step, a leak inspection step, and a dicing step.

Figure 17:
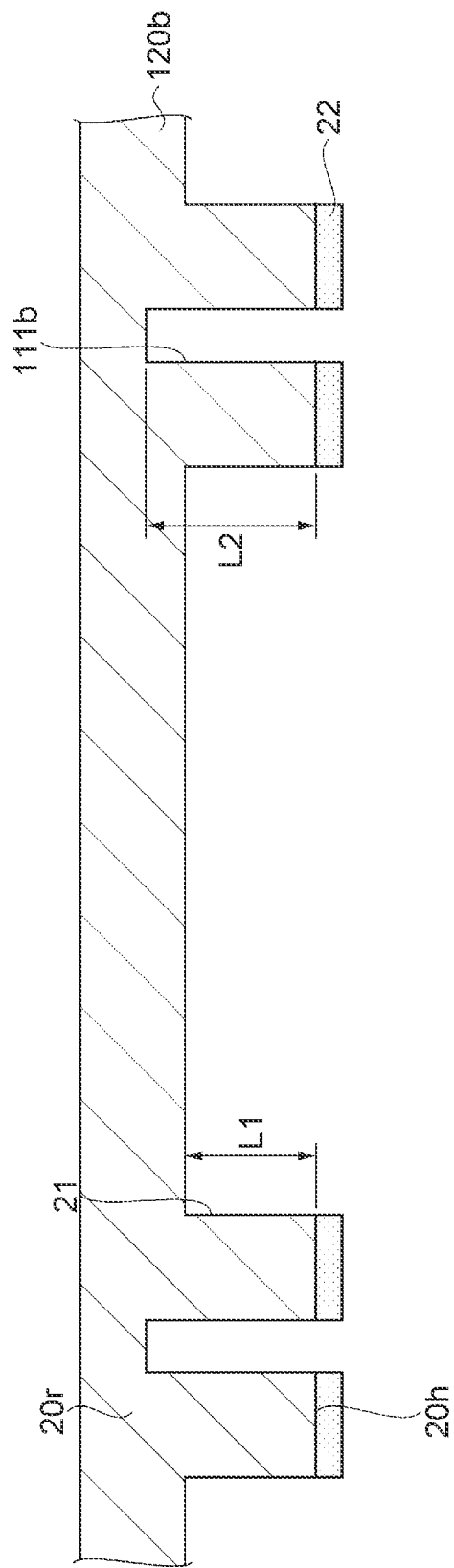
FIG. 17 is a cross-sectional view showing the method for manufacturing a resonator device.

In the lid wafer preparation step of step S101, in order to manufacture a plurality of resonator devices 1b at the same time, as shown in FIG. 17, a large plate-shaped lid wafer 120b including the third surface 20h and the fourth surface 20r in a front-back relationship with each other and including a plurality of dicing regions E is prepared. A bottomed first groove 111b is formed in a boundary portion between adjacent dicing regions E at the third surface 20h of the lid wafer 120b. In the plurality of dicing regions E of the lid wafer 120b, the recessed portion 21 recessed from the third surface 20h toward the fourth surface 20r side is formed by the photolithography technique and the etching technique. A metal film serving as the bonding member 22 is formed at the third surface 20h of the lid wafer 120b by the sputtering method or the like. A length L2 of the first groove 111b in the Z direction from the third surface 20h is formed to be longer than a length L1 of the recessed portion 21 in the Z direction from the third surface 20h.

In the base wafer preparation step of step S103, a large plate-shaped base wafer 110 including the first surface 10h and the second surface 10r in a front-back relationship with each other and including a plurality of dicing regions E is prepared. In the plurality of dicing regions E of the base wafer 110, the semiconductor substrate 11 at which the integrated circuit 40 including the oscillation circuit 41 electrically coupled to the resonator element 30 and the determination circuit 42 for determining the airtight state inside the cavity S is disposed, and a plurality of through electrodes 12 penetrating the first surface 10h, the second surface 10r, and the semiconductor substrate 11 are provided. Further, the bonding member 14 such as a gold bump for fixing the resonator element 30 is formed on the semiconductor substrate 11.

Figure 18:
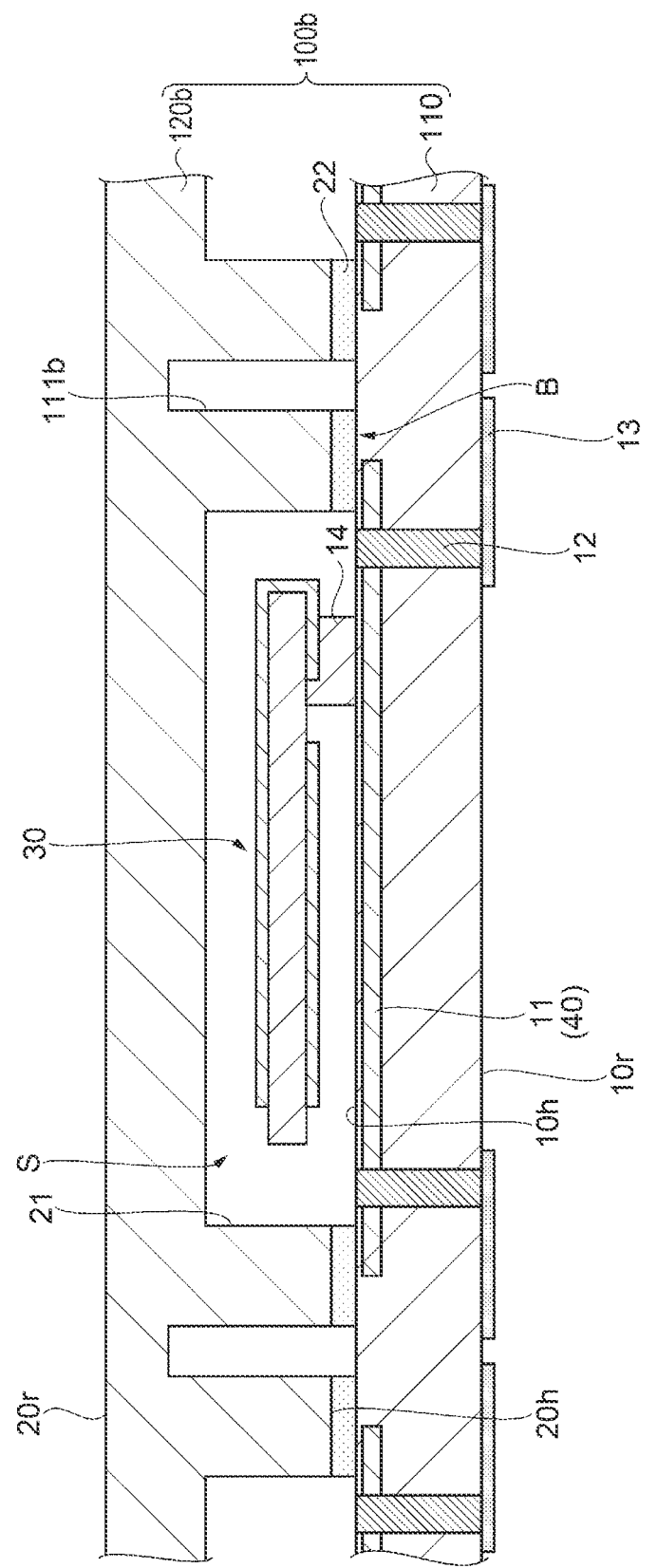
FIG. 18 is a cross-sectional view showing the method for manufacturing a resonator device.

In the external terminal formation step of step S107, a film of a metal such as Au or Cu is formed on the second surface 10r of the thinned base wafer 110 obtained in the first thinning step of step S106 or on the through electrodes 12 by the sputtering method or the like, and as shown in FIG. 18, the external terminals 13 electrically coupled to the through electrode 12 are formed by the photolithography technique and the etching technique.

Figure 19:
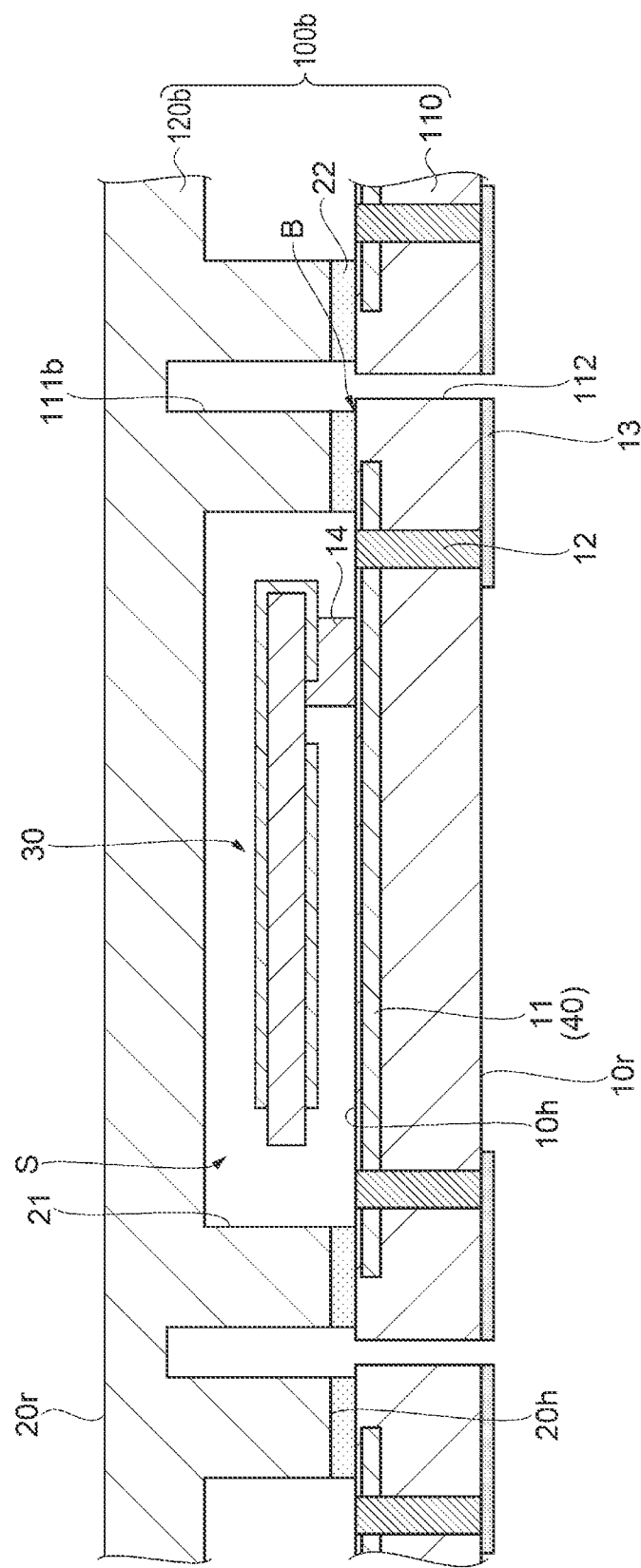
FIG. 19 is a cross-sectional view showing the method for manufacturing a resonator device.

In the second groove formation step of step S108, as shown in FIG. 19, the second groove 112 penetrating from the base wafer 110 side to the first groove 111b is formed in the boundary portion between adjacent dicing regions E of the device wafer 100b using a dicing saw or the like such that the bonding portion B between the lid wafer 120b and the base wafer 110 is exposed. As a result of this step, the bonding portion B between the base wafer 110 and the lid wafer 120b is exposed to the outside, and thus leak inspection can be performed in the leak inspection step of step S109 as the next step.

Figure 20:
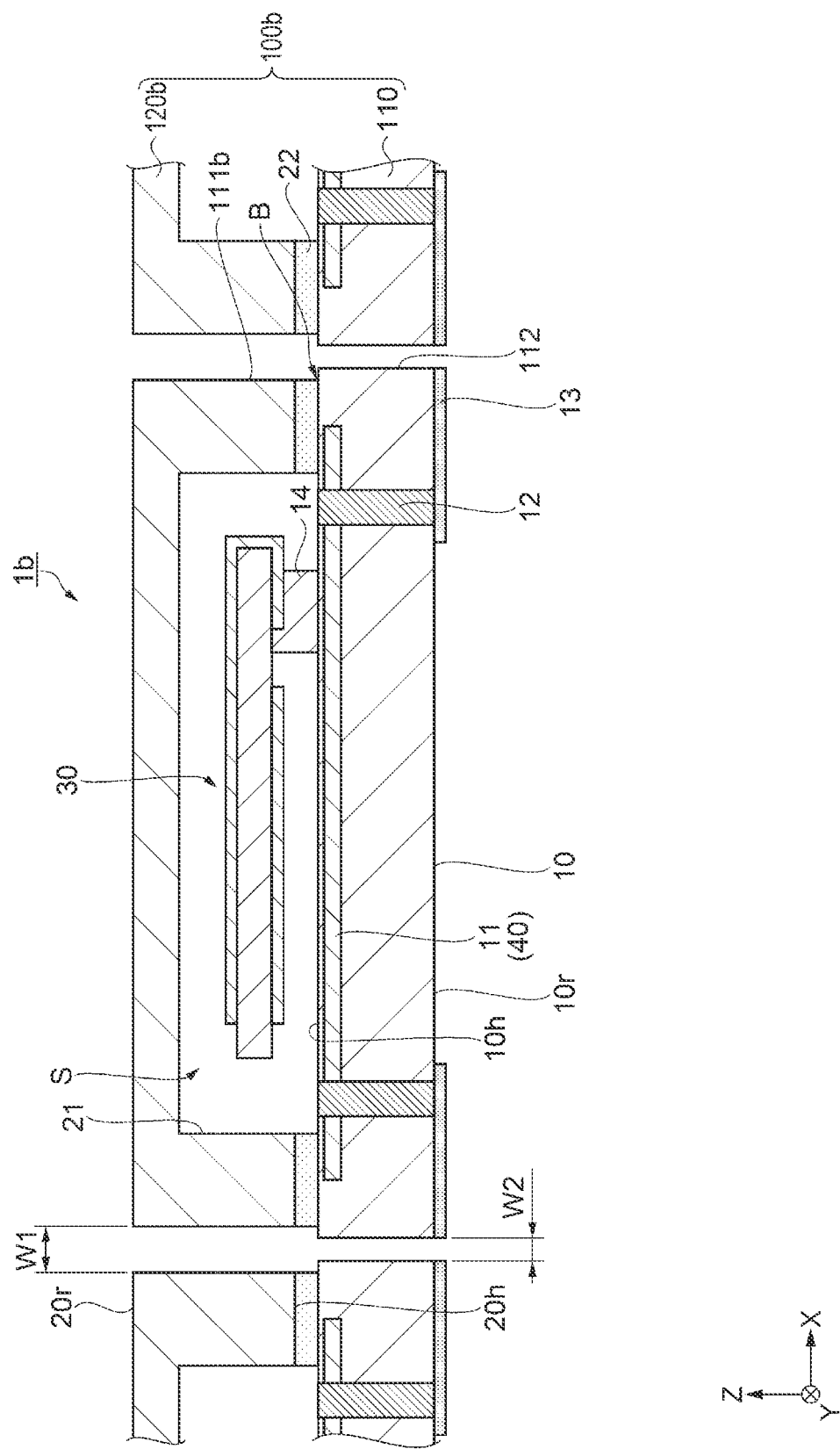
FIG. 20 is a cross-sectional view showing the method for manufacturing a resonator device.

In the dicing step of step S110, the fourth surface 20r of the lid wafer 120b is polished by a polishing device or the like so as to expose the first groove 111b to the lid wafer 120b side, and the lid wafer 120b is thinned as shown in FIG. 20. By thinning the lid wafer 120b until the first groove 111b is exposed, it is possible to dice the device wafer 100b for each dicing region E to obtain a plurality of resonator devices 1b. Therefore, this step is a step of thinning the fourth surface 20r of the lid wafer 120b and dicing the device wafer 100b for each dicing region E to obtain the plurality of resonator devices 1b. A width W2 of the second groove 112 is narrower than a width W1 of the first groove 111b.

As described above, according to the method for manufacturing the resonator device 1b of the present embodiment, the bonding portion B between the lid wafer 120b and the base wafer 110, which is a leakage factor, is exposed by forming the second groove 112 penetrating from the base wafer 110 side to the first groove 111b in the boundary portion between adjacent dicing regions E of the device wafer 100b, and the leak inspection can be performed in a wafer state, so that inspection is facilitated. Therefore, costs of the resonator device 1b can be reduced.

4. Fourth Embodiment

Next, a method for manufacturing a resonator device 1c according to a fourth embodiment will be described with reference to FIGS. 21 to 25.

The method for manufacturing the resonator device 1c according to the present embodiment is the same as the method for manufacturing the resonator device 1 according to the first embodiment except that operation contents in a lid wafer preparation step of step S201 are different as compared with the method for manufacturing the resonator device 1 according to the first embodiment, and the first groove formation step of step S9 is not included. Differences from the first embodiment described above will be mainly described, the same elements will be denoted by the same reference numerals, and description thereof will be omitted.

Figure 21:
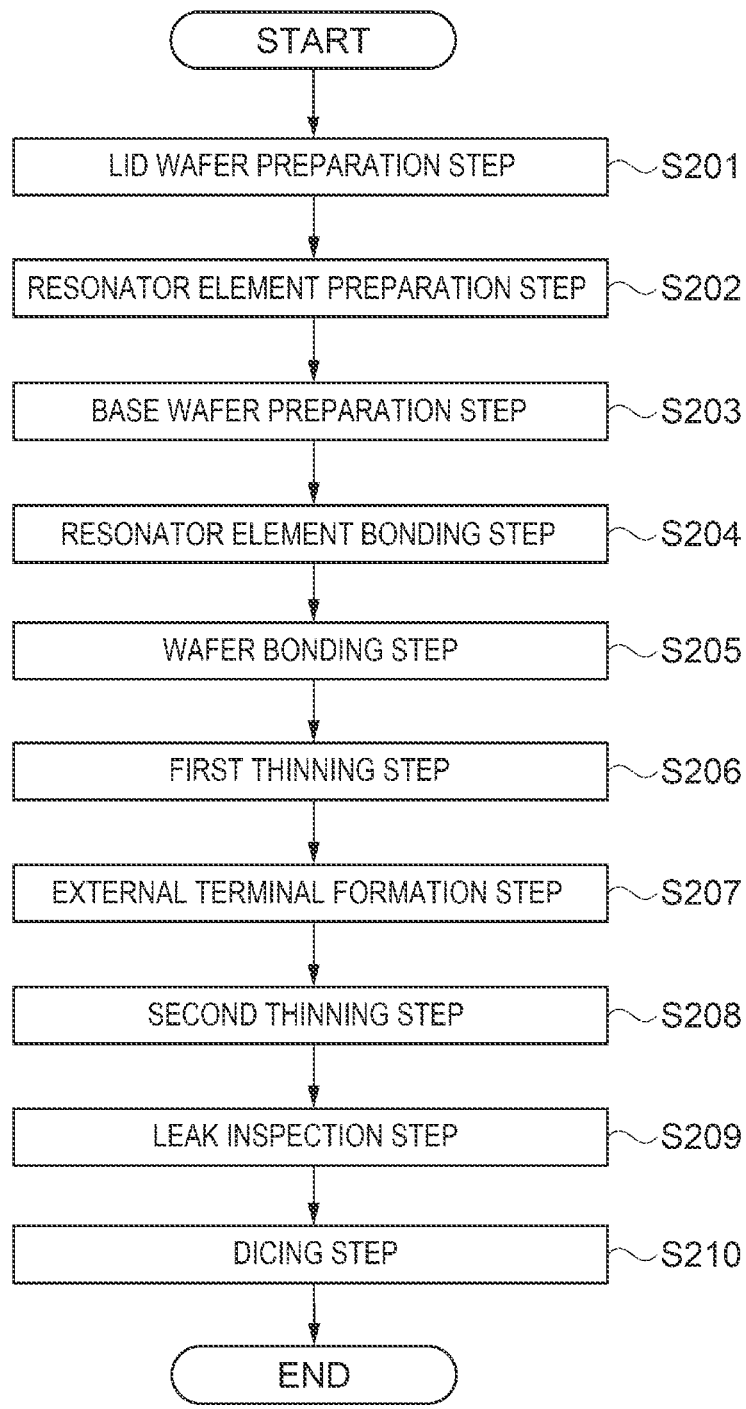
FIG. 21 is a flowchart showing a method for manufacturing a resonator device according to a fourth embodiment.

As shown in FIG. 21, the method for manufacturing the resonator device 1c according to the present embodiment includes a lid wafer preparation step, a resonator element preparation step, a base wafer preparation step, a resonator element bonding step, a wafer bonding step, a first thinning step, an external terminal formation step, a second thinning step, a leak inspection step, and a dicing step.

Figure 22:
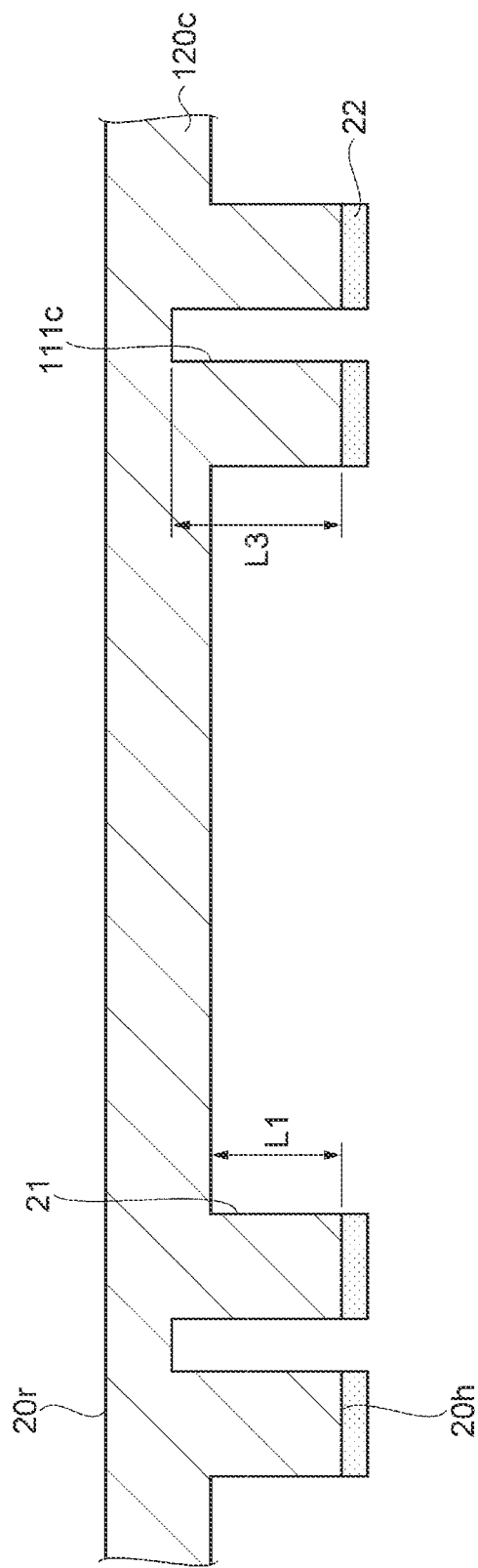
FIG. 22 is a cross-sectional view showing the method for manufacturing a resonator device.

In the lid wafer preparation step of step S201, in order to manufacture a plurality of resonator devices 1c at the same time, as shown in FIG. 22, a large plate-shaped lid wafer 120c including the third surface 20h and the fourth surface 20r in a front-back relationship with each other and including a plurality of dicing regions E is prepared. A bottomed first groove 111c is formed in a boundary portion between adjacent dicing regions E at the third surface 20h of the lid wafer 120c. In the plurality of dicing regions E of the lid wafer 120c, the recessed portion 21 recessed from the third surface 20h toward the fourth surface 20r side is formed by the photolithography technique and the etching technique. A metal film serving as the bonding member 22 is formed at the third surface 20h of the lid wafer 120c by the sputtering method or the like. A length L3 of the first groove 111c in the Z direction from the third surface 20h is formed to be longer than the length L1 of the recessed portion 21 in the Z direction from the third surface 20h.

In the base wafer preparation step of step S203, a large plate-shaped base wafer 110 including the first surface 10h and the second surface 10r in a front-back relationship with each other and including a plurality of dicing regions E is prepared. In the plurality of dicing regions E of the base wafer 110, the semiconductor substrate 11 at which the integrated circuit 40 including the oscillation circuit 41 electrically coupled to the resonator element 30 and the determination circuit 42 for determining the airtight state inside the cavity S is disposed, and a plurality of through electrodes 12 penetrating the first surface 10h, the second surface 10r, and the semiconductor substrate 11 are provided. Further, the bonding member 14 such as a gold bump for fixing the resonator element 30 is formed on the semiconductor substrate 11.

Figure 23:
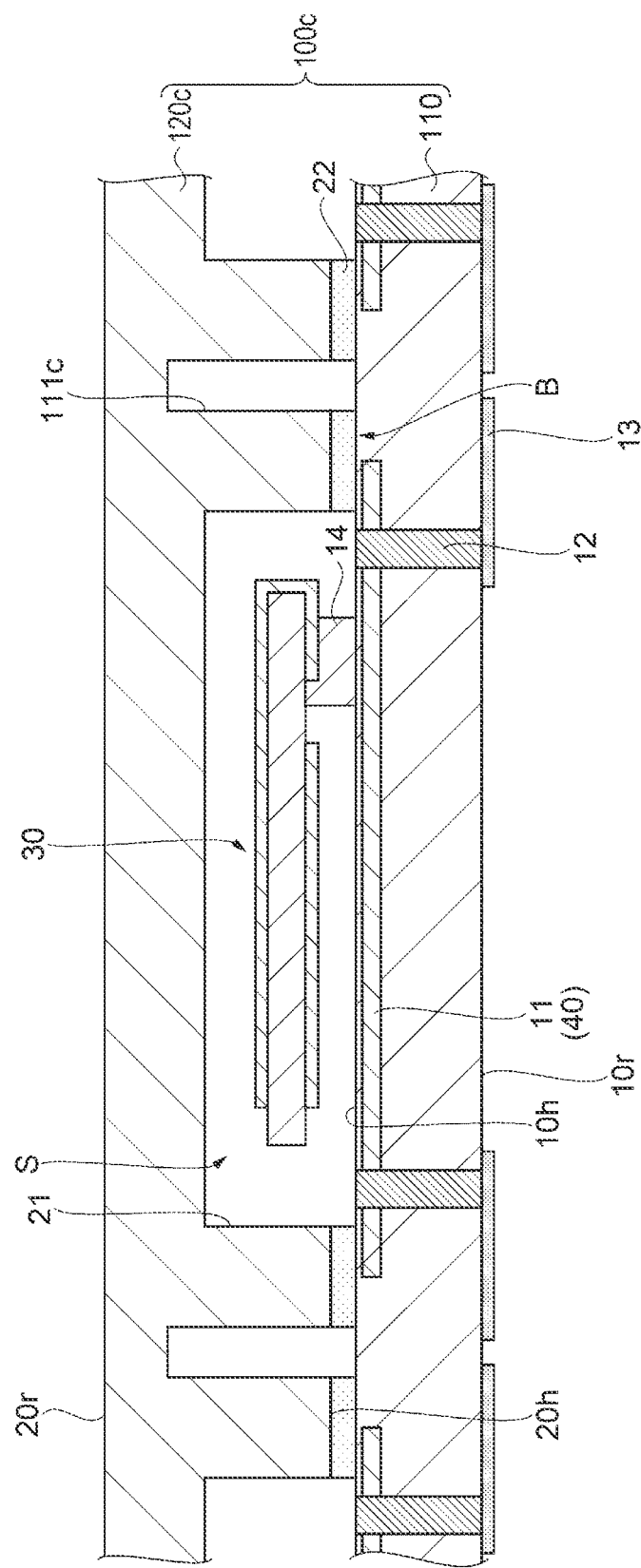
FIG. 23 is a cross-sectional view showing the method for manufacturing a resonator device.

In the external terminal formation step of step S207, a film of a metal such as Au or Cu is formed on the second surface 10r of the thinned base wafer 110 obtained in the first thinning step of step S206 or on the through electrodes 12 by the sputtering method or the like, and as shown in FIG. 23, the external terminals 13 electrically coupled to the through electrodes 12 are formed by the photolithography technique and the etching technique.

Figure 24:
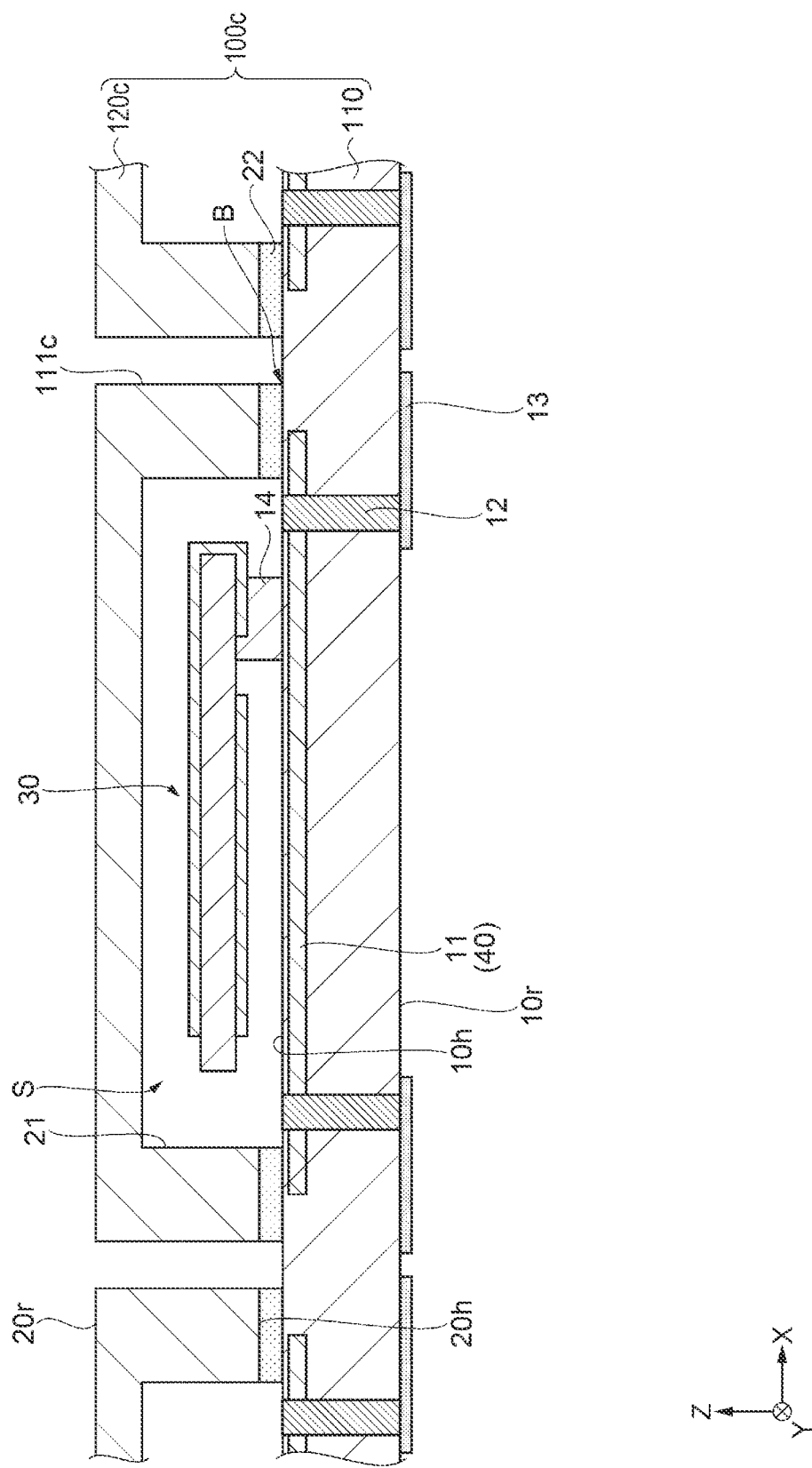
FIG. 24 is a cross-sectional view showing the method for manufacturing a resonator device.

In the second thinning step of step S208, the fourth surface 20r of the lid wafer 120c is polished by a polishing device or the like so as to expose the first groove 111c to the lid wafer 120c side, and the lid wafer 120c is thinned as shown in FIG. 24. As a result of this step, the bonding portion B between the base wafer 110 and the lid wafer 120c is exposed to the outside, and thus leak inspection can be performed in the leak inspection step of step S209 as the next step.

Figure 25:
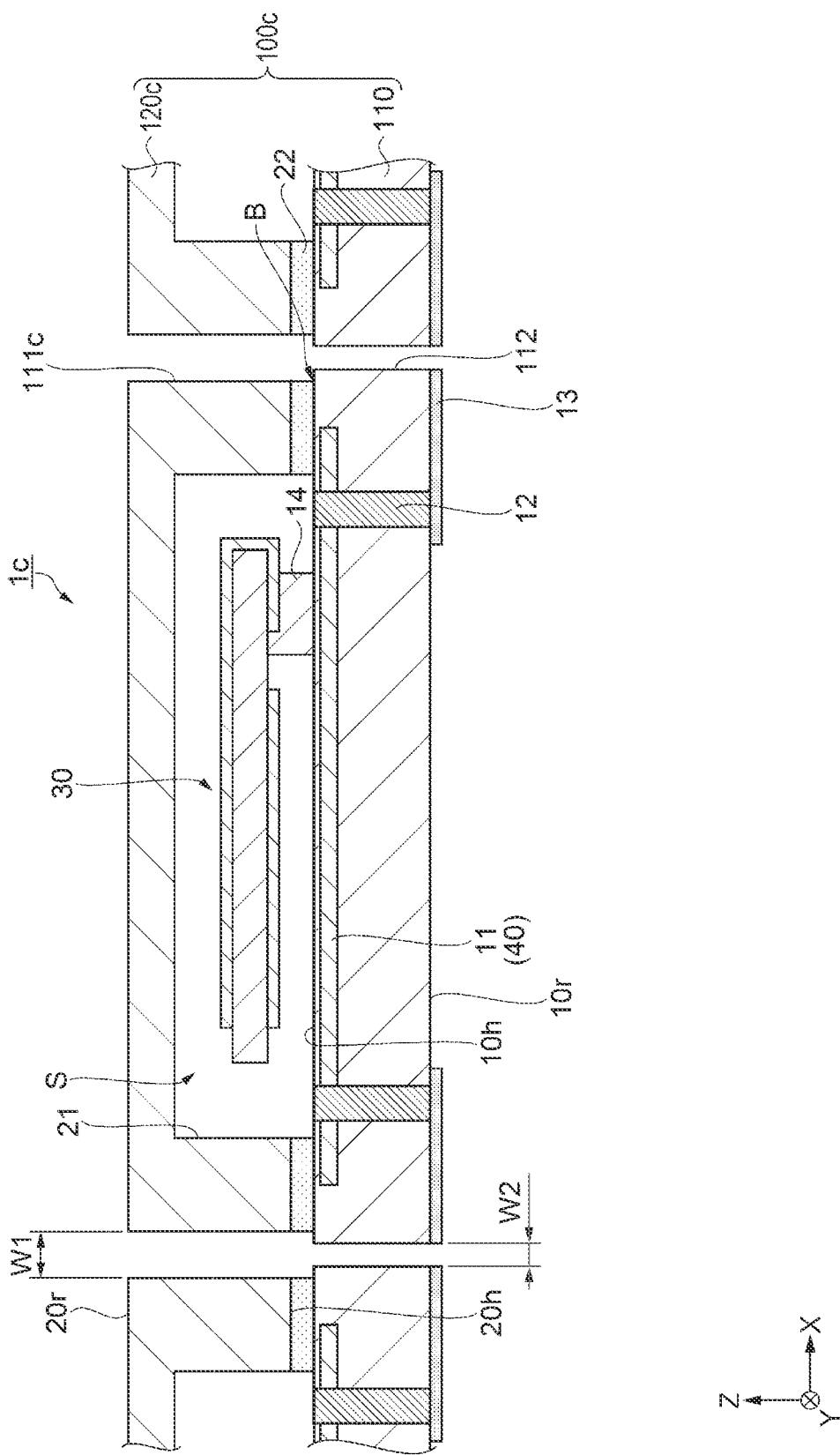
FIG. 25 is a cross-sectional view showing the method for manufacturing a resonator device.

In the dicing step of step S210, as shown in FIG. 25, the second groove 112 penetrating a device wafer 100c from the base wafer 110 side is formed using a dicing saw or the like. By forming the second groove 112, it is possible to dice the device wafer 100c for each dicing region E to obtain a plurality of resonator devices 1c. Therefore, this step is a step of forming the second groove 112 penetrating the device wafer 100c in the boundary portion where the first groove 111c is formed, and dicing the device wafer 100c for each dicing region E to obtain the plurality of resonator devices 1c. A width W2 of the second groove 112 is narrower than a width W1 of the first groove 111c.

As described above, according to the method for manufacturing the resonator device 1c of the present embodiment, the bonding portion B between the lid wafer 120c and the base wafer 110, which is a leakage factor, is exposed by thinning the fourth surface 20r of the lid wafer 120c and exposing the first groove 111c to the lid wafer 120c side, and the leak inspection can be performed in a wafer state, so that inspection is facilitated. Therefore, costs of the resonator device 1c can be reduced.

What is claimed is:

1. A resonator device comprising:
  a base including a semiconductor substrate having a first surface and a second surface in a front-back relationship with each other;
  a resonator element disposed at the first surface side; and
  a lid to be bonded to the first surface of the base, the lid and the base forming a cavity for accommodating the resonator element, wherein
  an integrated circuit is disposed at the semiconductor substrate, the integrated circuit including:
    an oscillation circuit electrically coupled to the resonator element;
    a memory circuit configured to store a reference value of an output characteristic of the resonator element; and
    a determination circuit configured to compare a detection value of the output characteristic of the resonator element with the reference value and determine an airtight state inside the cavity based on a comparison result.

2. The resonator device according to claim 1, wherein the output characteristic is an output voltage of the resonator element.

3. A method for manufacturing a resonator device including a base, a resonator element, and a lid forming a cavity for accommodating the resonator element with the base, the method comprising:
  preparing a base wafer having a first surface and a second surface in a front-back relationship with each other and including a plurality of dicing regions;
  disposing the resonator element at the first surface side of the base wafer for each of the dicing regions;
  preparing a lid wafer including a plurality of the dicing regions, and bonding the lid wafer to the first surface of the base wafer to obtain a device wafer formed with the cavity for accommodating the resonator element for each of the dicing regions;
  forming a bottomed first groove in a boundary portion between adjacent dicing regions of the device wafer such that a bonding portion between the lid wafer and the base wafer is exposed in the first groove;

inspecting an airtight state inside the cavity for each of the dicing regions; and forming a second groove penetrating the device wafer in the boundary portion where the first groove is formed, and dicing the device wafer for each of the dicing regions to obtain a plurality of the resonator devices.

4. The method for manufacturing a resonator device according to claim 3, wherein
the first groove is formed from the lid wafer side, and the second groove is formed from the base wafer side.

5. The method for manufacturing a resonator device according to claim 3, wherein
the first groove is formed from the base wafer side, and the second groove is formed from the lid wafer side.

6. The method for manufacturing a resonator device according to claim 3, wherein
a width of the second groove is narrower than a width of the first groove.

7. A method for manufacturing a resonator device including a base, a resonator element, and a lid forming a cavity for accommodating the resonator element with the base, the method comprising:

preparing a base wafer having a first surface and a second surface in a front-back relationship with each other and including a plurality of dicing regions;

disposing the resonator element at the first surface side of the base wafer for each of the dicing regions;

preparing a lid wafer having a third surface and a fourth surface in a front-back relationship with each other, including a plurality of the dicing regions, and formed with a bottomed first groove in a boundary portion between adjacent dicing regions at the third surface, and bonding the third surface of the lid wafer to the first surface of the base wafer to obtain a device wafer formed with the cavity for accommodating the resonator element for each of the dicing regions;

forming a second groove penetrating from the base wafer side to the first groove in the boundary portion between adjacent dicing regions of the device wafer;

inspecting an airtight state inside the cavity for each of the dicing regions; and thinning a thickness of the lid wafer from the fourth surface side of the lid wafer, and dicing the device wafer for each of the dicing regions to obtain a plurality of the resonator devices.

8. A method for manufacturing a resonator device including a base, a resonator element, and a lid forming a cavity for accommodating the resonator element with the base, the method comprising:

preparing a base wafer having a first surface and a second surface in a front-back relationship with each other and including a plurality of dicing regions;

disposing the resonator element at the first surface side of the base wafer for each of the dicing regions;

preparing a lid wafer having a third surface and a fourth surface in a front-back relationship with each other, including a plurality of the dicing regions, and formed with a bottomed first groove in a boundary portion between adjacent dicing regions at the third surface, and bonding the third surface of the lid wafer to the first surface of the base wafer to obtain a device wafer formed with the cavity for accommodating the resonator element for each of the dicing regions;

thinning a thickness of the lid wafer from the fourth surface side of the lid wafer to expose the first groove to the lid wafer side;

inspecting an airtight state inside the cavity for each of the dicing regions; and forming a second groove penetrating from the base wafer side to the first groove in the boundary portion between adjacent dicing regions of the device wafer, and dicing the device wafer for each of the dicing regions to obtain a plurality of the resonator devices.

9. The method for manufacturing a resonator device according to claim 7, wherein
a width of the second groove is narrower than a width of the first groove.

10. The method for manufacturing a resonator device according to claim 8, wherein
a width of the second groove is narrower than a width of the first groove.

11. The method for manufacturing a resonator device according to claim 3, wherein
the base wafer includes a semiconductor substrate, and
an integrated circuit is disposed at the semiconductor substrate for each of the dicing regions of the base wafer, the integrated circuit including an oscillation circuit electrically coupled to the resonator element and a determination circuit configured to determine an airtight state inside the cavity.

12. The method for manufacturing a resonator device according to claim 7, wherein
the base wafer includes a semiconductor substrate, and
an integrated circuit is disposed at the semiconductor substrate for each of the dicing regions of the base wafer, the integrated circuit including an oscillation circuit electrically coupled to the resonator element and a determination circuit configured to determine an airtight state inside the cavity.

13. The method for manufacturing a resonator device according to claim 8, wherein
the base wafer includes a semiconductor substrate, and
an integrated circuit is disposed at the semiconductor substrate for each of the dicing regions of the base wafer, the integrated circuit including an oscillation circuit electrically coupled to the resonator element and a determination circuit configured to determine an airtight state inside the cavity.

* * * * *